US012795904B2

(12) United States Patent

Kim et al.

(10) Patent No.: US 12,795,904 B2

(45) Date of Patent: Nov. 10, 2026

(54) SEMICONDUCTOR DEVICE

(71) Applicant: Samsung Electronics Co., Ltd., Suwon-si (KR)

(72) Inventors: Yangdoo Kim, Seoul (KR); Namgun Kim, Hwaseong-si (KR); Yonghwan Kim, Hwaseong-si (KR); Sangwuk Park, Hwaseong-si (KR); Minkyu Suh, Yongin-si (KR); Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 679 days.

(21) Appl. No.: 17/965,936

(22) Filed: Oct. 14, 2022

(65) Prior Publication Data

US 2023/0171954 A1 Jun. 1, 2023

(30) Foreign Application Priority Data

Nov. 29, 2021 (KR) ........................ 10-2021-0167516

(51) Int. Cl.

*H10B 12/00* (2023.01)

(52) U.S. Cl.

CPC ............. *H10B 12/50* (2023.02); *H10B 12/09* (2023.02); *H10B 12/315* (2023.02); *H10B 12/34* (2023.02)

(58) Field of Classification Search

CPC ...... H10B 12/50; H10B 12/315; H10B 12/34; H10B 12/09; H10D 1/716; H10D 1/68

See application file for complete search history.

(56) References Cited

U.S. PATENT DOCUMENTS

| | | | | |
|---|---|---|---|---|
| 8,883,601 | B2 | 11/2014 | Sako | |
| 9,299,709 | B2 | 3/2016 | Sasaki | |
| 9,761,591 | B2 * | 9/2017 | Kim | H10D 1/00 |
| 10,332,888 | B2 | 6/2019 | Liu et al. | |
| 10,559,569 | B2 | 2/2020 | Jang et al. | |
| 11,043,498 | B1 | 6/2021 | Han et al. | |
| 2011/0049600 | A1 * | 3/2011 | Aoki | H10B 12/50 438/386 |

(Continued)

FOREIGN PATENT DOCUMENTS

| | | | |
|---|---|---|---|
| CN | 110690346 | A | 1/2020 |
| KR | 1019950028061 | | 3/2001 |

(Continued)

*Primary Examiner* — Shih Tsun A Chou

(74) *Attorney, Agent, or Firm* — Muir Patent Law, PLLC

(57) ABSTRACT

A semiconductor device includes a substrate having a cell array region and a peripheral region, lower electrodes disposed on the cell array region, at least one supporter layer contacting the lower electrodes, a dielectric layer covering the lower electrodes and the at least one supporter layer, an upper electrode covering the dielectric layer, an interlayer insulating layer covering an upper surface and a side surface of the upper electrode, a peripheral contact plug passing through the interlayer insulating layer on the peripheral region of the substrate, and a first oxide layer between the upper electrode and the peripheral contact plug. The upper electrode includes at least one protruding region protruding in a lateral direction from the cell array region toward the peripheral region. The first oxide layer is disposed between the at least one protrusion region and the peripheral contact plug.

20 Claims, 17 Drawing Sheets

(56) References Cited

U.S. PATENT DOCUMENTS

| | | | | |
|---|---|---|---|---|
| 2012/0223413 | A1 | 9/2012 | Lindert | |
| 2013/0011988 | A1* | 1/2013 | Sako | H10D 1/716 438/381 |
| 2013/0052785 | A1* | 2/2013 | Mashiko | H10B 12/033 438/700 |
| 2014/0103491 | A1* | 4/2014 | Kim | H10D 1/716 257/532 |
| 2019/0214455 | A1* | 7/2019 | Kang | H10D 1/042 |
| 2020/0098763 | A1* | 3/2020 | Bae | H10B 12/033 |
| 2020/0219881 | A1* | 7/2020 | Lee | H10B 12/09 |

FOREIGN PATENT DOCUMENTS

| | | | |
|---|---|---|---|
| KR | 1020060035392 | A | 4/2006 |
| KR | 1020130132621 | A | 12/2013 |
| KR | 1020180049845 | A | 5/2018 |
| KR | 1020200034868 | A | 4/2020 |
| KR | 1020210089278 | A | 7/2021 |
| TW | 201240104 | A | 10/2012 |

* cited by examiner

SEMICONDUCTOR DEVICE

CROSS-REFERENCE TO RELATED APPLICATION(S)

This application claims benefit of priority to Korean Patent Application No. 10-2021-0167516 filed on Nov. 29, 2021 in the Korean Intellectual Property Office, the disclosure of which is incorporated by reference herein in its entirety.

BACKGROUND

The present inventive concept relates to a semiconductor device.

According to the development of the electronics industry and the needs of users, an electronic device becomes smaller in size and higher in performance. Accordingly, a semiconductor device used in an electronic device is desirable to be highly integrated and to have high-performance. For example, in a dynamic random access memory (DRAM) device, a technique for reducing a margin region between a cell array region and a peripheral circuit region is desirable.

SUMMARY

An aspect of the present inventive concept is to provide a semiconductor device having improved electrical characteristics and which is highly integrated.

According to an aspect of the present inventive concept, a semiconductor device includes a substrate having a cell array region and a peripheral region; a plurality of lower electrodes disposed on the cell array region; at least one supporter layer contacting the plurality of lower electrodes and extending in a direction, parallel to an upper surface of the substrate; a dielectric layer covering the plurality of lower electrodes and the at least one supporter layer; an upper electrode covering the dielectric layer; an interlayer insulating layer covering an upper surface and a side surface of the upper electrode; a peripheral contact plug passing through the interlayer insulating layer on the peripheral region of the substrate; and a first oxide layer between the upper electrode and the peripheral contact plug. The upper electrode comprises at least one protruding region protruding in a lateral direction parallel to the upper surface of the substrate and extending from the cell array region toward the peripheral region. The first oxide layer is disposed between the peripheral contact plug and the at least one protruding region.

According to an aspect of the present inventive concept, a semiconductor device includes a substrate having a cell array region and a peripheral region; a capacitor structure including a plurality of lower electrodes disposed on the cell array region, a dielectric layer on the plurality of lower electrodes, and an upper electrode covering the dielectric layer; an interlayer insulating layer covering the capacitor structure; an upper electrode contact plug passing through the interlayer insulating layer and extending into the upper electrode to be electrically connected to the upper electrode; and an upper oxide layer between the upper electrode and a portion of a side surface of the upper electrode contact plug.

According to an aspect of the present inventive concept, a semiconductor device includes a substrate having a cell array region and a peripheral region; a plurality of word lines disposed on the substrate, extending in a first direction; a plurality of bit lines disposed on the substrate, extending in a second direction, intersecting the first direction; a plurality of cell landing pads and a peripheral landing pad, disposed at a higher level than the plurality of word lines and the plurality of bit lines; a plurality of lower electrodes disposed on the plurality of cell landing pads on the cell array region, respectively; a dielectric layer covering the plurality of lower electrodes; an upper electrode covering the dielectric layer; an interlayer insulating layer covering an upper surface and a side surface of the upper electrode; an upper electrode contact plug passing through the interlayer insulating layer on the cell array region and electrically connected to the upper electrode; a peripheral contact plug passing through the interlayer insulating layer on the peripheral region and contacting the peripheral landing pad; an upper oxide layer between the upper electrode and a portion of a side surface of the upper electrode contact plug, the upper electrode contact plug contacting a portion of the upper electrode exposed by the upper oxide layer; and a lower oxide layer between the upper electrode and the peripheral contact plug.

BRIEF DESCRIPTION OF DRAWINGS

The above and other aspects, features, and advantages of the present inventive concept will be more clearly understood from the following detailed description, taken in conjunction with the accompanying drawings, in which:

FIG. 2 illustrates cross-sections of the semiconductor device of FIG. 1, taken along lines I-I' and II-II'.

FIG. 3A illustrates a partially enlarged view corresponding to portion 'A' of FIG. 2, and FIG. 4A illustrates a partially enlarged view corresponding to portion 'B' of FIG. 2.

FIG. 3B illustrates a partially enlarged view corresponding to portion 'A' of FIG. 2, and FIG. 4B illustrates a partially enlarged view corresponding to portion 'B' of FIG. 2.

DETAILED DESCRIPTION

Hereinafter, example embodiments of the present inventive concept will be described with reference to the accompanying drawings.

Figure 1:
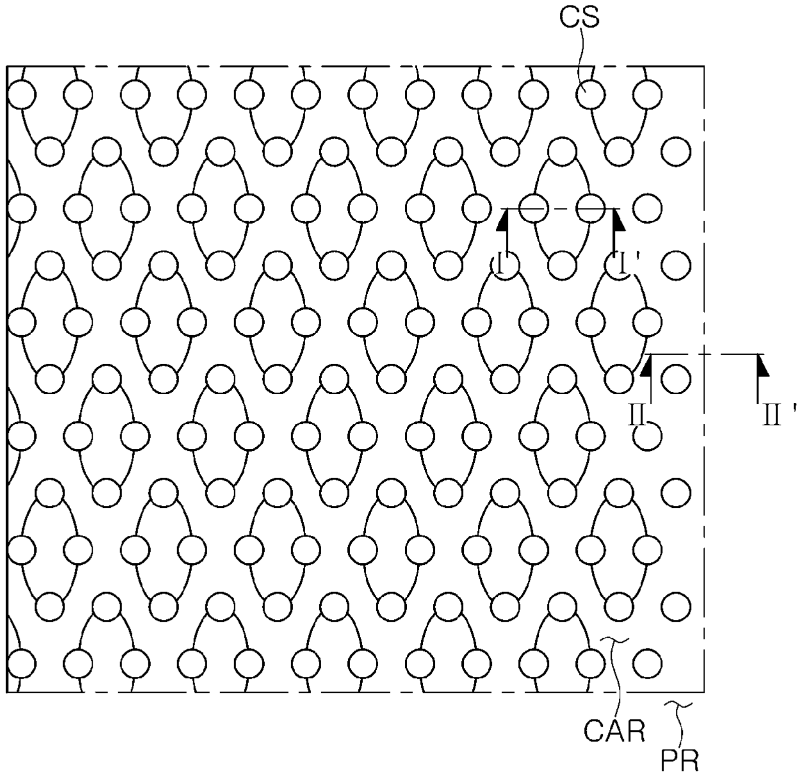
FIG. 1 is a schematic plan view of a semiconductor device according to example embodiments.
Figure 2:
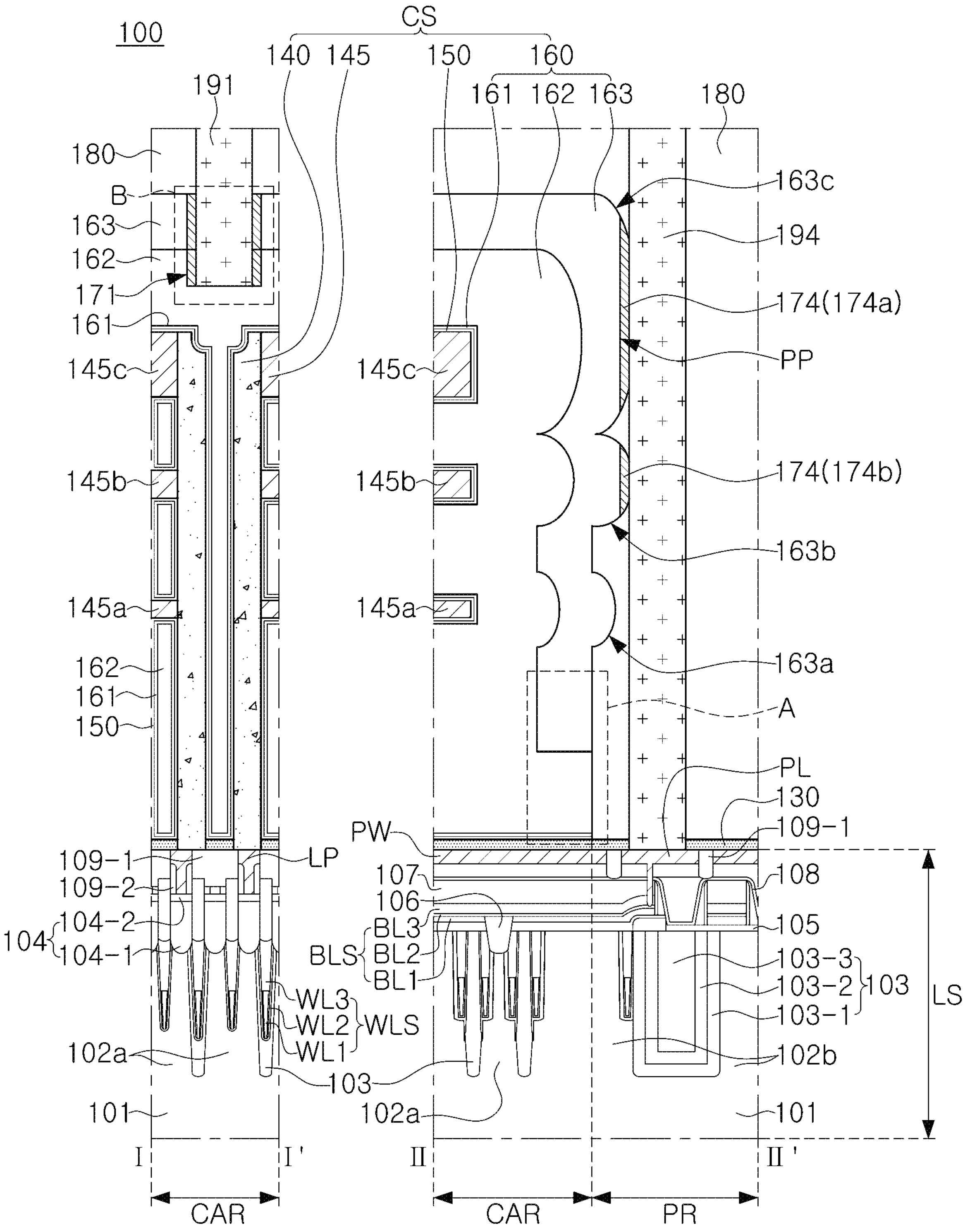
FIG. 2 is a schematic cross-sectional view of a semiconductor device according to example embodiments.

FIG. 1 is a schematic plan view of a semiconductor device 100 according to example embodiments. FIG. 2 is a schematic cross-sectional view of a semiconductor device 100 according to example embodiments. FIG. 2 illustrates cross-sections of the semiconductor device 100 of FIG. 1, taken along lines I-I' and II-II'.

Figure 3A:
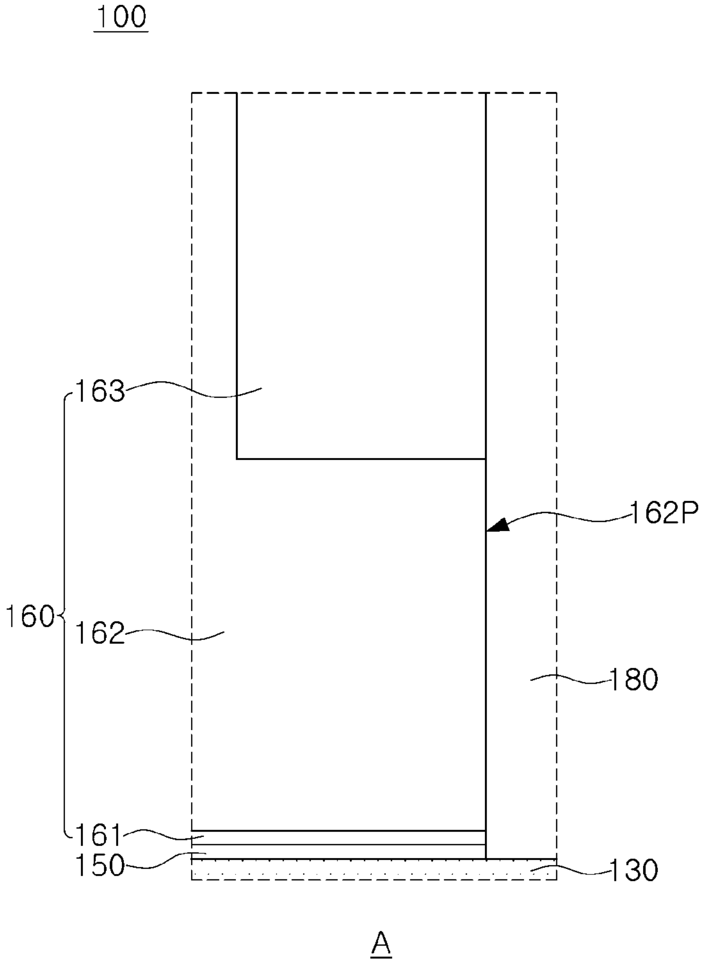
FIGS. 3A and 4A are partially enlarged cross-sectional views of a semiconductor device according to example embodiments.

FIG. 3A is a partially enlarged cross-sectional view of a semiconductor device 100 according to example embodiments. FIG. 3A illustrates a partially enlarged view corresponding to portion 'A' of FIG. 2.

Figure 4A:
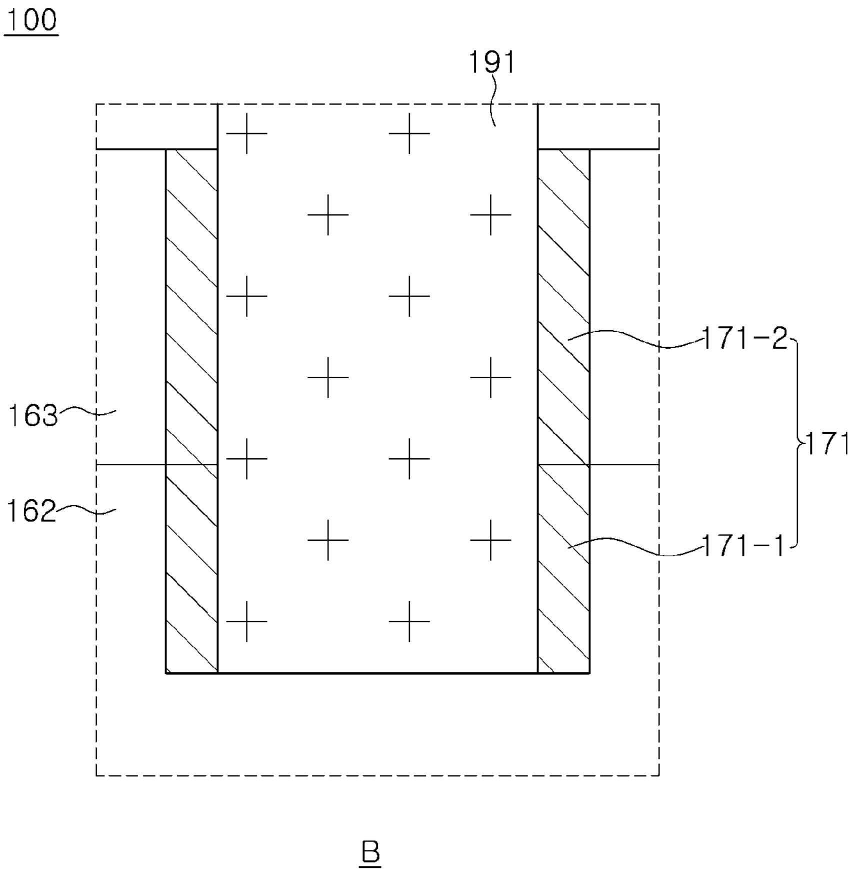

FIG. 4A is a partially enlarged cross-sectional view of a semiconductor device 100 according to example embodiments. FIG. 4A illustrates a partially enlarged view corresponding to portion 'B' of FIG. 2.

Referring to FIGS. 1 and 2, a semiconductor device 100 may include a lower structure LS, an etch stop layer 130 on the lower structure LS, a capacitor structure CS including a plurality of lower electrodes 140, a dielectric layer 150, and an upper electrode 160, oxide layers 171 and 174, an interlayer insulating layer 180, and contact plugs 191 and 194.

The lower structure LS may include a substrate 101 including active regions 102*a*, a device isolation region 103 defining the active regions 102*a* in the substrate 101, a word line structure WLS embedded and extending in the substrate 101 and including a word line WL1, and a bit line structure BLS on the substrate 101, intersecting and extending in the word line structure WLS, and including a bit line BL1 and BL2.

The semiconductor device 100 may include, for example, a cell array of a dynamic random access memory (DRAM). For example, the bit line BL may be connected to a first impurity region of the active regions 102*a*, the capacitor structure CS may be electrically connected to a second impurity region of the active regions 102*a*, and data may be stored in the capacitor structure CS.

The substrate 101 may include a cell array region CAR and a peripheral region PR. The capacitor structure CS in which data is stored may be disposed on the cell array region CAR. Therefore, the cell array region CAR of the substrate 101 may be defined as a region of the substrate 101 overlapping the capacitor structure CS in which data is stored. The peripheral region PR may be disposed around the cell array region CAR. A word line driver, a sense amplifier, row and column decoders, and control circuits may be disposed on the peripheral circuit region.

The substrate 101 may include or may be formed of a semiconductor material, such as a group IV semiconductor, a group III-V compound semiconductor, and a group II-VI compound semiconductor. For example, the group IV semiconductor may include or may be silicon, germanium, or silicon-germanium. The substrate 101 may further include impurities. The substrate 101 may be a silicon substrate, a silicon-on-insulator (SOI) substrate, a germanium substrate, a germanium-on-insulator (GOI) substrate, a silicon-germanium substrate, or a substrate including an epitaxial layer.

The active regions 102*a* may be defined in the substrate 101 by the device isolation region 103. The active region 102*a* may have a bar shape, and may be disposed in the substrate 101 in an island shape extending in one direction. The active regions 102*a* may have first and second impurity regions at a predetermined depth from an upper surface of the substrate 101. The first and second impurity regions may be spaced apart from each other. The first and second impurity regions may serve as source/drain regions of a transistor formed by the word line WL1. In example embodiments, depths of the first and second impurity regions in the source region and the drain region may be different from each other. The active regions 102*a* may be disposed in the cell array region CAR. In an example embodiment, the semiconductor device 100 may further include dummy active regions 102*b* disposed in the peripheral region PR. Like the active regions 102*a*, the dummy active regions 102*b* may be defined in the substrate 101 by the device isolation region 103. As used herein, the term "dummy" is used to refer to a component that has the same or similar structure and shape as other components but does not have a substantial function and exists only as a pattern in the device.

The device isolation region 103 may be formed by a shallow trench isolation (STI) process. The device isolation region 103 may surround the active regions 102*a* and may electrically separate the active regions 102*a* from each other. The device isolation region 103 may be formed of an insulating material, for example, silicon oxide, silicon nitride, or a combination thereof. The device isolation region 103 may include a plurality of regions having different depths of a lower end according to a width of a trench in which the substrate 101 is etched. The device isolation region 103 may include a first device isolation layer defining the active regions 102*a* in the cell array region CAR, and a second device isolation layer defining the dummy active regions 102*b* in the peripheral region PR. A dummy gate structure may be disposed on the dummy active regions 102*b*, but the present inventive concept is not limited thereto. In the peripheral region PR, the device isolation region 103 may include a plurality of layers. For example, as illustrated in FIG. 2, in a region adjacent to the word line WL1, the device isolation region 103 may include a first insulating liner 103-1, a second insulating liner 103-2, and a buried insulating layer 103-3. The first insulating liner 103-1, the second insulating liner 103-2, and the buried insulating layer 103-3 may be sequentially formed in the etched trench of the substrate 101 in which the device isolation region 103 is disposed. In an example embodiment, the first insulating liner 103-1 and the buried insulating layer 103-3 may include or may be formed of silicon oxide, and the second insulating liner 103-2 may include or may be formed of silicon nitride.

The word line structure WLS may include a word line WL1, a gate dielectric layer WL2, and a gate capping layer WL3. The word line WL1 may be disposed to cross the active regions 102*a* and extend in the first direction X. For example, a pair of adjacent word lines WL1 may be disposed to cross one active region 102*a*. An upper surface of the word line WL1 may be located at a level lower than the upper surface of the substrate 101. In this specification, the high and low of the term "level" used may be defined based on a substantially planar upper surface of the substrate 101. The word line WL1 may constitute a gate of a buried channel array transistor (BCAT), but the present inventive concept is not limited thereto. According to embodiments, the word line WL1 may have a shape disposed on the substrate 101. The word line WL1 may be formed of a conductive material such as at least one of polycrystalline silicon (Si), titanium (Ti), titanium nitride (TiN), tantalum (Ta), tantalum nitride (TaN), tungsten (W), tungsten nitride (WN), and aluminum (Al). According to embodiments, the word line WL1 may have a double-layer structure formed of different materials. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The gate dielectric layer WL2 may conformally cover side and bottom surfaces of the word line WL1. The gate dielectric layer WL2 may include or may be formed of at least one of silicon oxide, silicon nitride, and silicon oxynitride. The gate dielectric layer WL2 may be, for example, a silicon oxide layer, or an insulating layer having a high-κ dielectric material.

The gate capping layer WL3 may be disposed on the word line WL1. The gate capping layer WL3 may be formed of an insulating material, for example, silicon nitride.

The bit line structure BLS may extend in one direction, perpendicular to the word line WL1, for example, in the Y direction. The bit line structure BLS may include a bit line (BL1 and BL2) and a bit line capping pattern BL3 on the bit line (BL1 and BL2).

The bit line (BL1 and BL2) may include a first conductive pattern BL1 and a second conductive pattern BL2, sequentially stacked on each other. The first conductive pattern BL1 may include or may be formed of a semiconductor material such as polycrystalline silicon. The first conductive pattern BL1 may be in contact with the first impurity region. The second conductive pattern BL2 may include or may be formed of a metal material such as titanium (Ti), tantalum (Ta), tungsten (W), and aluminum (Al). According to embodiments, a separate conductive pattern disposed between the first and second conductive patterns BL1 and BL2 may be disposed, and the conductive pattern may be, for example, a layer in which a portion of the first conductive pattern BL1 is silicided. According to embodiments, the number and thicknesses of the conductive patterns constituting the bit line may be variously changed. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The bit line capping pattern BL3 may be disposed on the bit line (BL1 and BL2). The bit line capping pattern BL3 may include or may be formed of an insulating material, for example, silicon nitride. According to embodiments, the bit line capping pattern BL3 may include a plurality of capping pattern layers, and may be formed of different materials. For example, the number of capping pattern layers and/or the type of material constituting the bit line capping pattern BL3 may be variously changed according to embodiments.

In an example embodiment, the bit line structure BLS may be disposed on the word line structure WLS, and a buffer insulating layer 105 may be disposed between the bit line structure BLS and the word line structure WLS.

In an example embodiment, the lower structure LS may further include a bit line contact pattern 106 passing through the first conductive pattern BL1 and contacting the first impurity region of the active regions 102*a*. The bit line contact pattern 106 may be electrically connected to the bit line structure BLS. A lower surface of the bit line contact pattern 106 may be located at a higher level than the upper surface of the word line WL1. According to embodiments, the bit line contact pattern 106 may be integrally formed with the first conductive pattern BL1.

In an example embodiment, the lower structure LS may further include a lower electrode contact pattern 104, cell landing pads LP, a dummy pattern PW, and a peripheral landing pad PL.

The lower electrode contact pattern 104 may be connected to one region of the active regions 102*a*, for example, the second impurity region. The lower electrode contact pattern 104 may be disposed between adjacent bit lines BL1 and BL2 and between adjacent word lines WL1. A lower surface of the lower electrode contact pattern 104 may be located at a lower level than the upper surface of the substrate 101, and may be located at a higher level than the lower surface of the bit line contact pattern 106. The lower electrode contact pattern 104 may be insulated from the bit line contact pattern 106 by a spacer structure. The lower electrode contact pattern 104 may include or may be formed of a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). In an example embodiment, in the lower electrode contact pattern 104, a semiconductor layer 104-1 and a metal-semiconductor compound layer 104-2 may be disposed on the semiconductor layer 104-1. The metal-semiconductor compound layer 104-2 may be a silicide layer in which a portion of the semiconductor layer 104-1 is silicided, and may include or may be formed of, for example, cobalt silicide (CoSi), titanium silicide (TiSi), nickel silicide (NiSi), tungsten silicide. (Wsi), or other metal silicides. According to embodiments, the metal-semiconductor compound layer 104-2 may be omitted.

The cell landing pad LP, the dummy pattern PW, and the peripheral landing pad PL may be conductive patterns disposed on the bit line structure BLS and the lower electrode contact pattern 104. The cell landing pad LP, the dummy pattern PW, and the peripheral landing pad PL may be defined by separating a conductive layer into individual elements by an insulating pattern 109-1. The cell landing pad LP may be disposed on the cell array region CAR, and may be electrically connected to the lower electrode contact pattern 104. The dummy pattern PW may be disposed on a dummy region at an edge of the cell array region CAR. The peripheral landing pad PL may be electrically connected to the bit line structure BLS on the peripheral region PR. According to embodiments, the peripheral landing pad PL may be electrically connected to the word line structure WLS or may be connected to other peripheral circuit elements. In an example embodiment, the cell landing pad LP, the dummy pattern PW, and the peripheral landing pad PL may include a barrier layer and a conductive layer. The barrier layer may include or may be formed of a metal nitride covering lower and side surfaces of the conductive layer, for example, at least one of titanium nitride (TiN), tantalum nitride (TaN), and tungsten nitride (WN). The conductive layer may include or may be formed of a conductive material such as at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

In an example embodiment, the semiconductor device 100 may include an insulating pattern 109-1 and an insulating liner 108. The insulating pattern 109-1 may pass through the cell landing pad LP, the dummy pattern PW, and the peripheral landing pad PL. The cell landing pad LP may be separated as a plurality of cell landing pads LP by the insulating pattern 109-1. The insulating pattern 109-1 may include or may be formed of an insulating material, for example, at least one of silicon oxide, silicon nitride, and silicon oxynitride. The insulating liner 108 may cover peripheral transistors disposed in the peripheral region PR, and may separate the insulating pattern 109-1 from the peripheral transistors.

The etch stop layer 130 may be disposed on the lower structure LS. The etch stop layer 130 may extend into the peripheral region PR while covering the lower structure LS on the cell array region CAR.

The capacitor structure CS may be disposed on the cell array region CAR of the lower structure LS. The capacitor structure CS may include a plurality of lower electrodes 140, at least one supporter layers 145, a dielectric layer 150, and an upper electrode 160.

The plurality of lower electrodes 140 may include or may be formed of a conductive material, for example, polysilicon or titanium nitride (TiN) doped with an impurity. The plurality of lower electrodes 140 may have a pillar shape or a cylindrical shape. Each of the plurality of lower electrodes 140 may pass through the etch stop layer 130 to be electrically connected to the cell landing pad LP.

The supporter layers 145 may be disposed to be spaced apart from each other in a Z-direction, perpendicular to the upper surface of the lower structure LS, and may extend in a horizontal direction, perpendicular to the Z-direction. The supporter layers 145 may be in contact with the plurality of lower electrodes 140, and may connect sidewalls of the plurality of adjacent lower electrodes 140. The supporter layers 145 may be a structure supporting the plurality of lower electrodes 140 having a high aspect ratio. The supporter layers 145 may include or may be formed of, for example, at least one of silicon oxide, silicon nitride, and silicon oxynitride. In an example embodiment, the supporter layers 145 may include a first supporter layer 145*a*, a second supporter layer 145*b* disposed on the first supporter layer 145*a*, and a third supporter layer 145*c* disposed on the second supporter layer 145*b*, sequentially stacked on each other. A thickness of the first supporter layer 145*a* may be thinner than a thickness of the second supporter layer 145*b*, and the thickness of the second supporter layer 145*b* may be thinner than a thickness of the third supporter layer 145*c*. A distance between the lower structure LS and a lower surface of the first supporter layer 145*a* may be longer than a distance between an upper surface of the first supporter layer 145*a* and a lower surface of the second supporter layer 145*b*. The distance between the upper surface of the first supporter layer 145*a* and the lower surface of the second supporter layer 145*b* may be longer than a distance between an upper surface of the second supporter layer 145*b* and a lower surface of the third supporter layer 145*c*. The number, thicknesses, and arrangement relationship of the supporter layers are not limited thereto, and may be variously changed.

The dielectric layer 150 may cover the plurality of lower electrodes 140 and the supporter layers 145 on the lower structure LS. The dielectric layer 150 may conformally cover upper and side surfaces of the plurality of lower electrodes 140, the upper surface of the etch stop layer 130, and exposed surfaces of the supporter layers 145. The dielectric layer 150 may include a high-κ material, silicon oxide, silicon nitride, silicon oxynitride, or a combination thereof. According to embodiments, the dielectric layer 150 may be an oxide, a nitride, a silicide, an oxynitride, or a silicified oxynitride, including one of hafnium (Hf), aluminum (Al), zirconium (Zr), and lanthanum (La).

The upper electrode 160 may have a structure covering the plurality of lower electrodes 140, the supporter layers 145, and the dielectric layer 150. The upper electrode 160 may have a structure filling spaces between two adjacent lower electrodes among the plurality of lower electrodes 140 and spaces between two adjacent supporter layers among the supporter layers 145.

The upper electrode 160 may include a metal-containing layer 161, a first material layer 162, and a second material layer 163, sequentially formed on the plurality of lower electrodes 140. The metal-containing layer 161 may be a conductive layer that conformally covers the dielectric layer 150. The metal-containing layer 161 may be formed of, for example, titanium nitride (TiN). The first material layer 162 may fill the spaces between two adjacent lower electrodes among the plurality of lower electrodes 140 and spaces between two adjacent supporter layers among the supporter layers 145 while covering the metal-containing layer 161. The first material layer 162 may include or may be formed of a semiconductor material. In an embodiment, the first material layer 162 may include or may be formed of, for example, silicon germanium (SiGe) containing impurities. The second material layer 163 may conformally cover upper and side surfaces of the first material layer 162. A thickness of the second material layer 163 may be thinner than a thickness of the first material layer 162. The second material layer 163 may include or may be formed of a material, different from a material of the first material layer 162. The second material layer 163 may include or may be formed of a semiconductor material. In an embodiment, the second material layer 163 may include or may be formed of, for example, silicon (Si) including impurities. As the first and second material layers 162 and 163 include doped semiconductor materials, the upper electrode 160 may be formed together with the metal-containing layer 161.

The upper electrode 160 may include at least one protruding region PP protruding from the cell array region CAR toward the peripheral region PR in a horizontal direction. The protrusion regions PP may be disposed on a side surface of the upper electrode 160. The side surface of the upper electrode 160 may include a portion having a convex shape in the horizontal direction by the protruding regions PP. The protrusion regions PP may have a structure formed while covering the supporter layers 145 extending in the horizontal direction from the plurality of lower electrodes 140. In an embodiment, the upper electrode 160 may be conformally formed on the supporter layers 145, and the upper electrode 160 may include portions horizontally protruding from a side surface of each of the supporter layers 145. The horizontally-protruding portions of the upper electrode 160 may correspond to the protrusion regions PP. Each of the protrusions PP and a corresponding one of the supporter layers 145 may be positioned at substantially the same level. Therefore, the protruding regions PP may include portions located on substantially the same level as the supporter layers 145, respectively.

In an example embodiment, the second material layer 163 may include protruding regions PP. The protrusion regions PP of the second material layer 163 may include a first protrusion 163*a*, a second protrusion 163*b*, and a third protrusion 163*c*. The first protrusion 163*a* may be a protrusion including a portion located at substantially the same level as the first supporter layer 145*a*, the second protrusion 163*b* may be a protrusion including a portion located at substantially the same level as the second supporter layer 145*b*, and the third protrusion 163*c* may be a protrusion including a portion located at substantially the same level as the third supporter layer 145*c*. The protruding distances of the first to third protrusions 163*a*, 163*b*, and 163*c* may be different from each other according to thicknesses of the supporter layers 145*a*, 145*b*, and 145*c*, respectively, corresponding to the protrusions 163*a*, 163*b*, and 163*c*. In an example embodiment, at least a portion of the first to third protrusions 163*a*, 163*b*, and 163*c* may protrude from the cell array region CAR, and may be disposed on the peripheral region PR.

Referring to FIG. 3A, the second material layer 163 may be disposed to be spaced apart from the lower structure LS and the etch stop layer 130 in the Z-direction.

The first material layer 162 may further include an extension region 162P extending into a space between the metal-containing layer 161 and the second material layer 163. For example, the extension region 162P may extend into a space between a lower end (or a lower surface) of the second material layer 163 and the metal-containing layer 161. The second material layer 163 may overlap the extension region 162P of the first material layer 162 in the Z-direction. The second material layer 163 may expose a side surface of the extension region 162P while covering an upper surface of the extension region 162P without covering the side surface of the extension region 162P. In an example embodiment, an outer side surface of the second material layer 163 may be coplanar with an exposed side surface of the extension region 162P, but the present inventive concept is not limited thereto. According to embodiments, the outer side surface of the second material layer 163 may not be coplanar with and the exposed side surface of the extension region 162P. For example, the outer side surface of the second material layer 163 and the exposed side surface of the extension region 162P may form a stepped side surface of the upper electrode 160. The first material layer 162 may include or may be formed of a material different from that of the second material layer 163, and the first material layer 162 may have etch selectivity with respect to the second material layer 163.

The interlayer insulating layer 180 may cover the capacitor structure CS and the etch stop layer 130 on the lower structure LS. The interlayer insulating layer 180 may cover upper and side surfaces of the upper electrode 160. The interlayer insulating layer 180 may include or may be formed of silicon oxide. According to embodiments, the interlayer insulating layer 180 may be formed of a plasma enhanced (PE)-tetra ethyl ortho silica (TEOS) film, phosphorous silicate glass (PSG), or high density plasma (HDP) oxide.

The contact plugs 191 and 194 may include an upper electrode contact plug 191 electrically connected to the upper electrode 160, and a peripheral contact plug 194 electrically connected to the lower structure LS.

The upper electrode contact plug 191 may pass through a portion of the interlayer insulating layer 180 and a portion of the upper electrode 160 on the cell array region CAR, to be electrically connected to the upper electrode 160. In an example embodiment, the upper electrode contact plug 191 may pass through the second material layer 163 and may extend into the first material layer 162, to be connected to the upper electrode 160. For example, a lower end of the upper electrode contact plug 191 may be buried in the first material layer 162. The present invention is not limited thereto. According to embodiments, the upper electrode contact plug 191 may partially extend into the second material layer 163 without contacting the first material layer 162. For example, a lower end of the upper electrode contact plug 191 may be buried in the second material layer 163.

The peripheral contact plug 194 may pass through the interlayer insulating layer 180 and the etch stop layer 130 on the peripheral region PR, to be electrically connected to the lower structure LS. In an example embodiment, the peripheral contact plug 194 may be in contact with the peripheral landing pad PL to be electrically connected to the bit line structure BLS, but the present inventive concept is not limited thereto. The peripheral contact plug 194 may include a conductive material, identical or similar to that of the upper electrode contact plug 191.

The oxide layers 171 and 174 may include an upper oxide layer 171 between the upper electrode 160 and the upper electrode contact plug 191, and a lower oxide layer 174 between the upper electrode 160 and the peripheral contact plug 194. In this specification, the lower oxide layer 174 may be referred to as a 'first oxide layer,' and the upper oxide layer 171 may be referred to as a 'second oxide layer.'

Referring to FIGS. 2 and 4A, the upper oxide layer 171 may surround at least a portion of an outer side surface of the upper electrode contact plug 191. At least a portion of a side surface of the upper electrode contact plug 191 may be in contact with the upper oxide layer 171, and a lower surface of the upper electrode contact plug 191 may be in contact with the upper electrode 160. In an example embodiment, the upper oxide layer 171 may include a lower oxide region 171-1 between the first material layer 162 and the upper electrode contact plug 191, and an upper oxide region 171-2 between the second material layer 163 and the upper electrode contact plug 191. The lower oxide region 171-1 may be a region in which at least a portion of the first material layer 162 is oxidized through a contact hole for forming the upper electrode contact plug 191. The upper oxide region 171-2 may be a region in which at least a portion of the second material layer 163 is oxidized through the contact hole. The lower oxide region 171-1 and the upper oxide region 171-2 may include or may be formed of different materials from each other. In an example embodiment, the lower oxide region 171-1 may include or may be formed of silicon germanium oxide, and the upper oxide region 171-2 may include or may be formed of silicon oxide. For example, prior to forming the upper electrode contact plug 191 in the contact hole, a portion of the first material layer 162 exposed by the contact hole and a portion of the second material layer 163 exposed by the contact hole may be oxidized to form the lower oxide region 171-1 and the upper oxide region 171-2, respectively.

Referring to FIG. 2, the lower oxide layer 174 may be disposed between at least one protruding region PP, among the protruding regions PP, and the peripheral contact plug 194. In an example embodiment, the lower oxide layer 174 may include a lower oxide layer 174*b* disposed between the second protrusion 163*b* of the second material layer 163 and the peripheral contact plug 194, and a lower oxide layer 174*a* disposed between the third protrusion 163*c* of the second material layer 163 and the peripheral contact plug 194. One side surface of the lower oxide layer 174 may be in contact with the second material layer 163, and the other side surface of the lower oxide layer 174 may be in contact with the peripheral contact plug 194. The lower oxide layer 174 may be a region in which at least a portion of the second material layer 163 is oxidized through a contact hole for forming the peripheral contact plug 194. In an example embodiment, the lower oxide layer 174 may include or may be formed of silicon oxide. The lower oxide layer 174 may electrically separate the upper electrode 160 from the peripheral contact plug 194. The lower oxide layer 174 may reduce a required margin region between the upper electrode 160 and the peripheral contact plug 194 due to a structure of the upper electrode 160 including the protruding regions PP. The lower oxide layer 174 may electrically separate the upper electrode 160 from the peripheral contact plug 194 even when a relative distance between the upper electrode 160 and the peripheral contact plug 194 is shortened. Therefore, a semiconductor device 100 having a high degree of integration while improving electrical characteristics may be provided. An oxide of the second material layer 163 may have a relatively higher insulating property than an oxide of the first material layer 162. Therefore, the lower oxide layer 174, which may be the oxide of the second material layer 163, may effectively improve a current leakage problem between the upper electrode 160 and the peripheral contact plug 194.

Figure 3B:
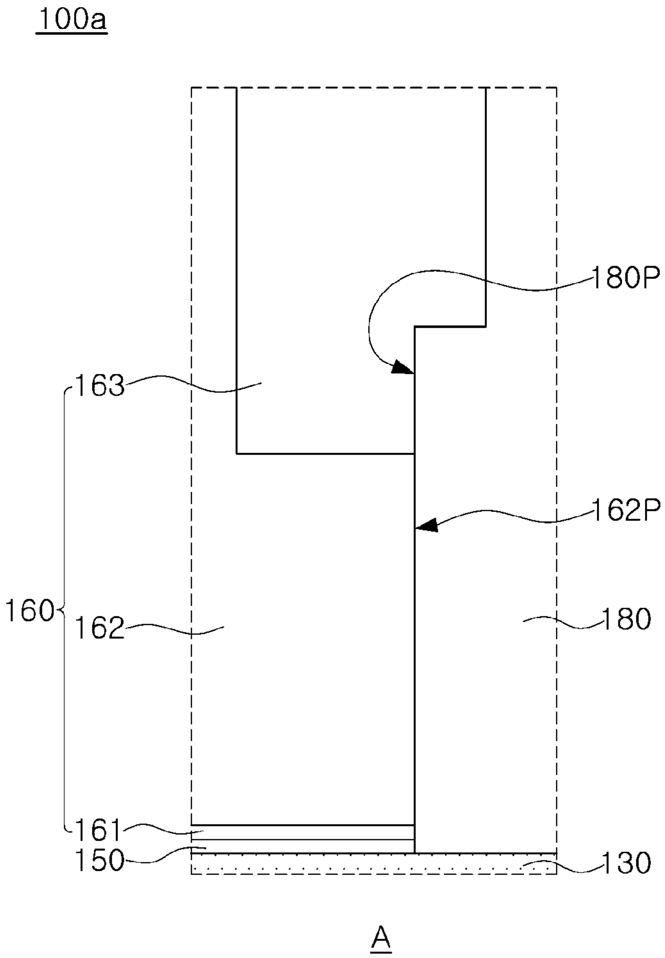
FIGS. 3B and 4B are partially enlarged cross-sectional views of a semiconductor device according to example embodiments.

FIG. 3B is a partially enlarged cross-sectional view of an example of a semiconductor device according to example embodiments. FIG. 3B illustrates a partially enlarged view corresponding to portion 'A' of FIG. 2.

Referring to FIG. 3B, an upper electrode 160 of a semiconductor device 100*a* may have a structure in which a lower region of the upper electrode 160 is recessed by a predetermined depth in a direction toward an inside of the upper electrode 160. In an example embodiment, a lower region of a second material layer 163 and an extended region 162P of a first material layer 162 may be recessed into the upper electrode 160 to have a recessed region. Due to the recess region, the second material layer 163 may have a step difference. To electrically separate the first and second material layers 162 and 163 from peripheral contact plugs 194, an etching process may be performed relatively deeper or relatively longer in an etching time, as compared to FIG. 3A, to form the recess region of the upper electrode 160. An interlayer insulating layer 180 may include a protrusion 180P extending into a region (i.e., the recessed region of the upper electrode 160) in which a portion of the first material layer 162 and a portion of the second material layer 163 are recessed. The present invention is not limited thereto. According to embodiments, in a process of forming the first and second material layers 162 and 163, the etching process may be performed to be relatively thinner or relatively shorter in an etching time, as compared to FIG. 3A. The lower region of the second material layer 163 and the extension region 162P of the first material layer 162 may include protrusions in a direction toward the interlayer insulating layer 180.

Figure 4B:
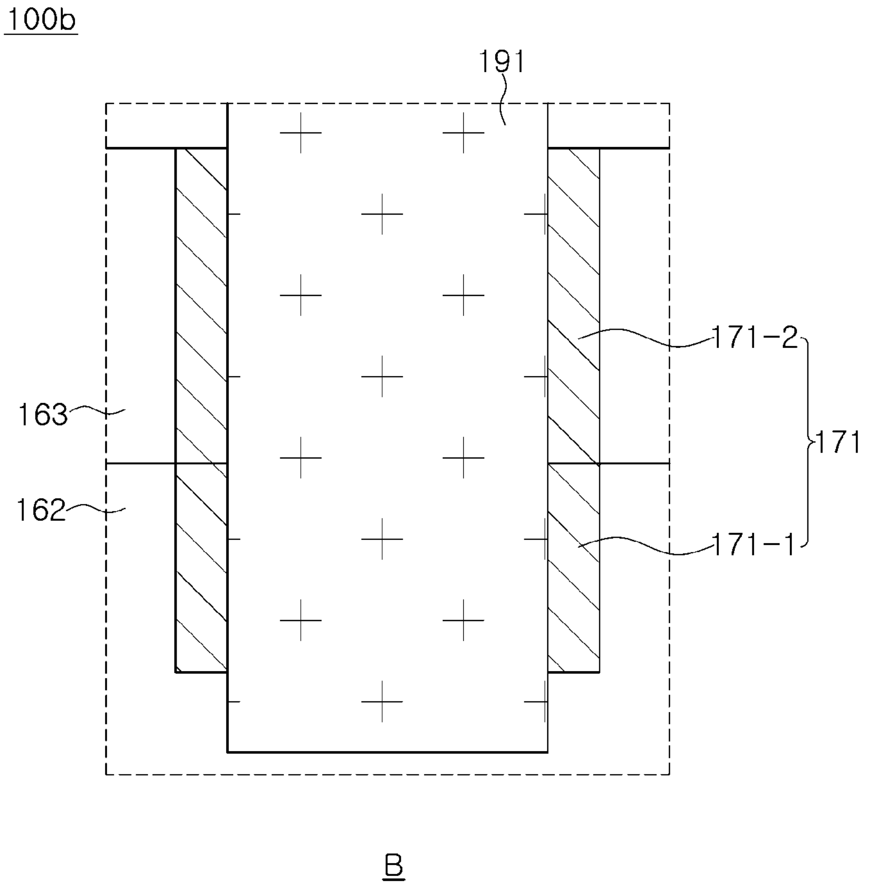

FIG. 4B is a partially enlarged cross-sectional view of an example of a semiconductor device according to example embodiments. FIG. 4B illustrates a partially enlarged view corresponding to portion 'B' of FIG. 2.

Referring to FIG. 4B, a semiconductor device 100*b* according to example embodiments may have an upper electrode contact plug 191, different from that of the semiconductor device 100 of FIG. 2. The upper electrode contact plug 191 may further extend from a region contacting an upper oxide layer 171 in a direction toward a lower structure LS. Therefore, a portion of a lower region among side surfaces of the upper electrode contact plug 191 may be not in contact with the upper oxide layer 171. This may be a structure formed by forming the upper oxide layer 171 through a contact hole for forming the upper electrode contact plug 191, and forming a hole deeper than the contact hole in a subsequent process. For example, the upper electrode contact plug 191 may extend downwardly beyond a lower end of the upper oxide layer 171, thereby increasing a contact area between the upper electrode contact plug 191 and the upper electrode 160.

Figure 5:
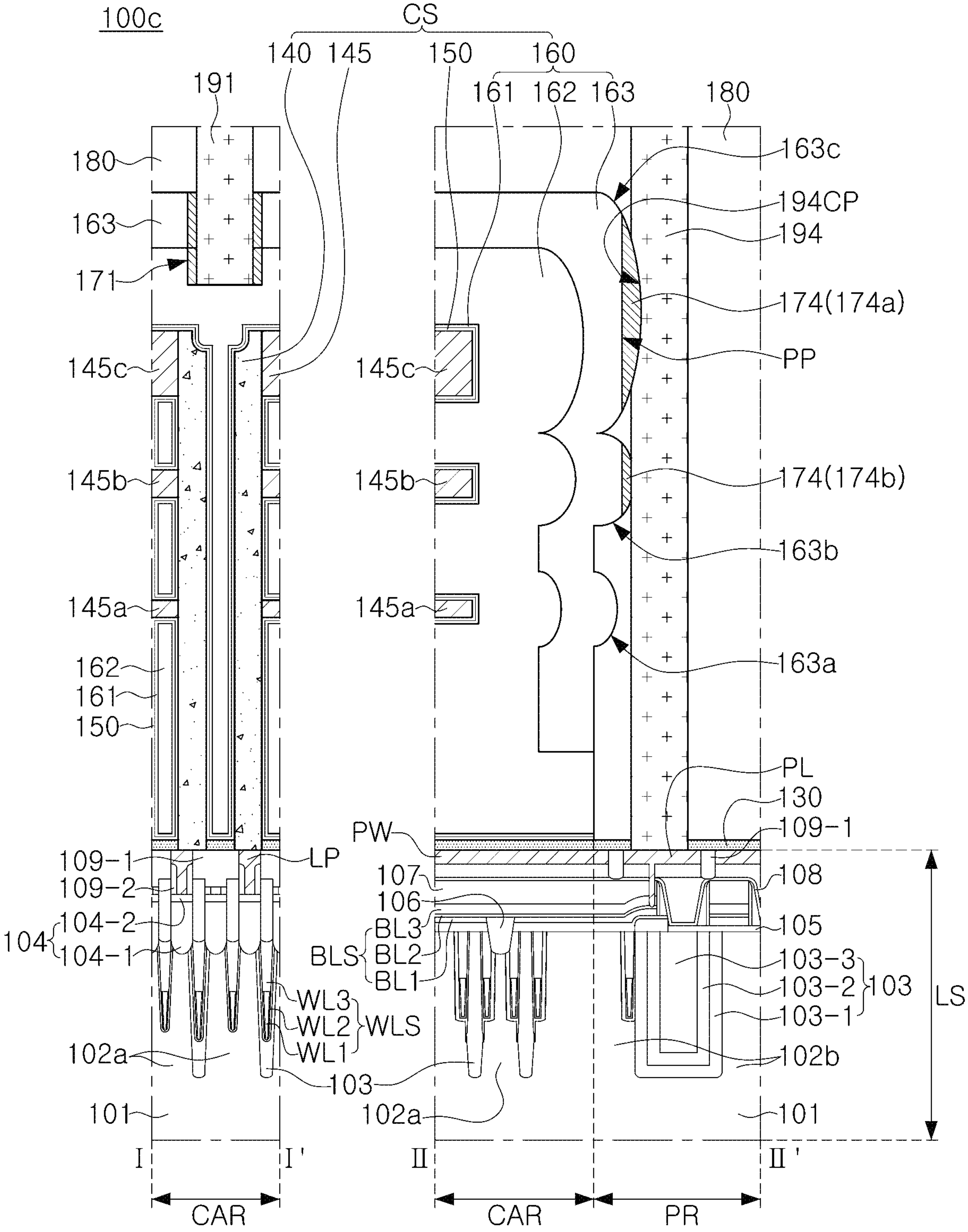
FIG. 5 is a schematic cross-sectional view of a semiconductor device according to example embodiments.

FIG. 5 is a schematic cross-sectional view of a semiconductor device 100*c* according to example embodiments. FIG. 5 illustrates regions corresponding to cross-sections of the semiconductor device of FIG. 1, taken along lines I-I' and II-II'.

Referring to FIG. 5, a lower oxide layer 174 may have a portion extending into a peripheral contact plug 194 along a side surface of an upper electrode contact plug 191. The peripheral contact plug 194 may include a concave portion 194CP that may be a recessed portion into the peripheral contact plug 194, in at least a portion of a region contacting the lower oxide layer 174. The concave portion 194CP may be a layer formed by an oxidation process in which a portion of a second material layer 163 is not etched in a process of forming a contact hole for forming the peripheral contact plug 194. The present invention is not limited thereto. In an embodiment, a contact hole (e.g., a second opening OP2 in FIG. 9G) may be formed to expose protruding regions PP of an upper electrode 160, and the exposed protruding region PP may be oxidized to form the lower oxide layer 174 that extends toward the contact hole. For example, the lower oxide layer 174 may extend beyond an inner surface of the contact hole toward the contact hole. After forming the lower oxide layer 174, the peripheral contact plug 194 may be formed in the contact hole to have the concave portion 194CP.

Figure 6:
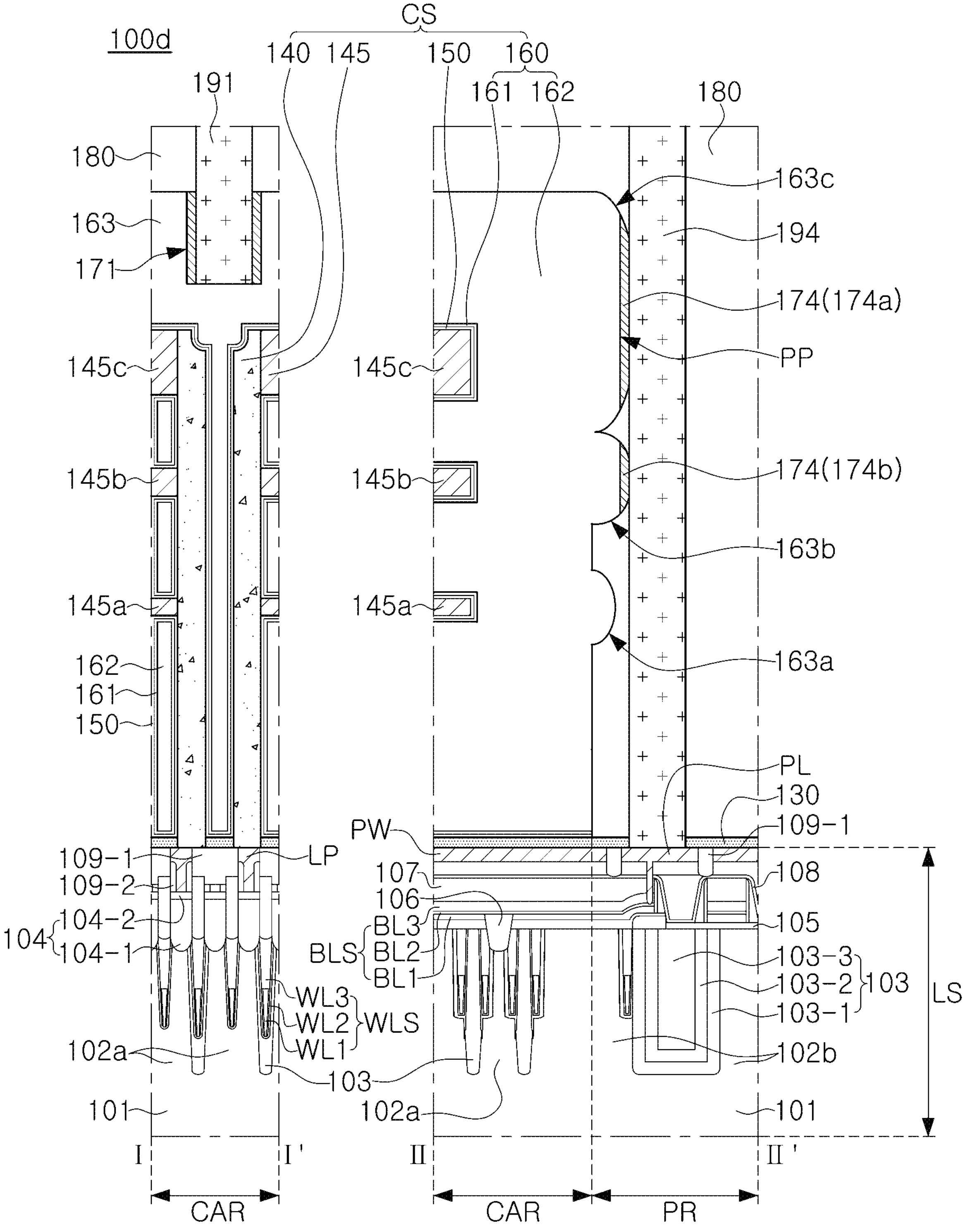
FIG. 6 is a schematic cross-sectional view of a semiconductor device according to example embodiments.

FIG. 6 is a schematic cross-sectional view of a semiconductor device 100*d* according to example embodiments. FIG. 6 illustrates regions corresponding to cross-sections of the semiconductor device of FIG. 1, taken along lines I-I' and II-II'.

Referring to FIG. 6, an upper electrode 160 of a semiconductor device 100*d* according to example embodiments may not include a second material layer 163, unlike FIG. 2. For example, the upper electrode 160 may include a metal-containing layer 161 and a first material layer 162.

The first material layer 162 may include at least one protruding region PP protruding from a cell array region CAR in a horizontal direction toward a peripheral region PR. The protruding regions PP may be disposed on a side surface of the first material layer 162. A side surface of the first material layer 162 may include a portion having a convex shape in the horizontal direction by the protruding regions PP. The protruding regions PP may include portions located at substantially the same level as supporter layers 145. Protrusion distances of the protruding regions PP may be different from each other, according to a thickness of the supporter layer 145 corresponding to each of the protruding regions PP, or the like.

A lower oxide layer 174 may be disposed between a peripheral contact plug 194 and at least one protruding region PP, among the protruding regions PP of the first material layer 162. One side surface of the lower oxide layer 174 may be in contact with the first material layer 162, and the other side surface of the lower oxide layer 174 may be in contact with the peripheral contact plug 194. The lower oxide layer 174 may electrically separate the first material layer 162 from the peripheral contact plug 194. Unlike FIG. 2, since an operation of forming the second material layer 163 is omitted in a process of forming the upper electrode 160, the semiconductor device 100*d* having a high production yield may be provided.

Figure 7:
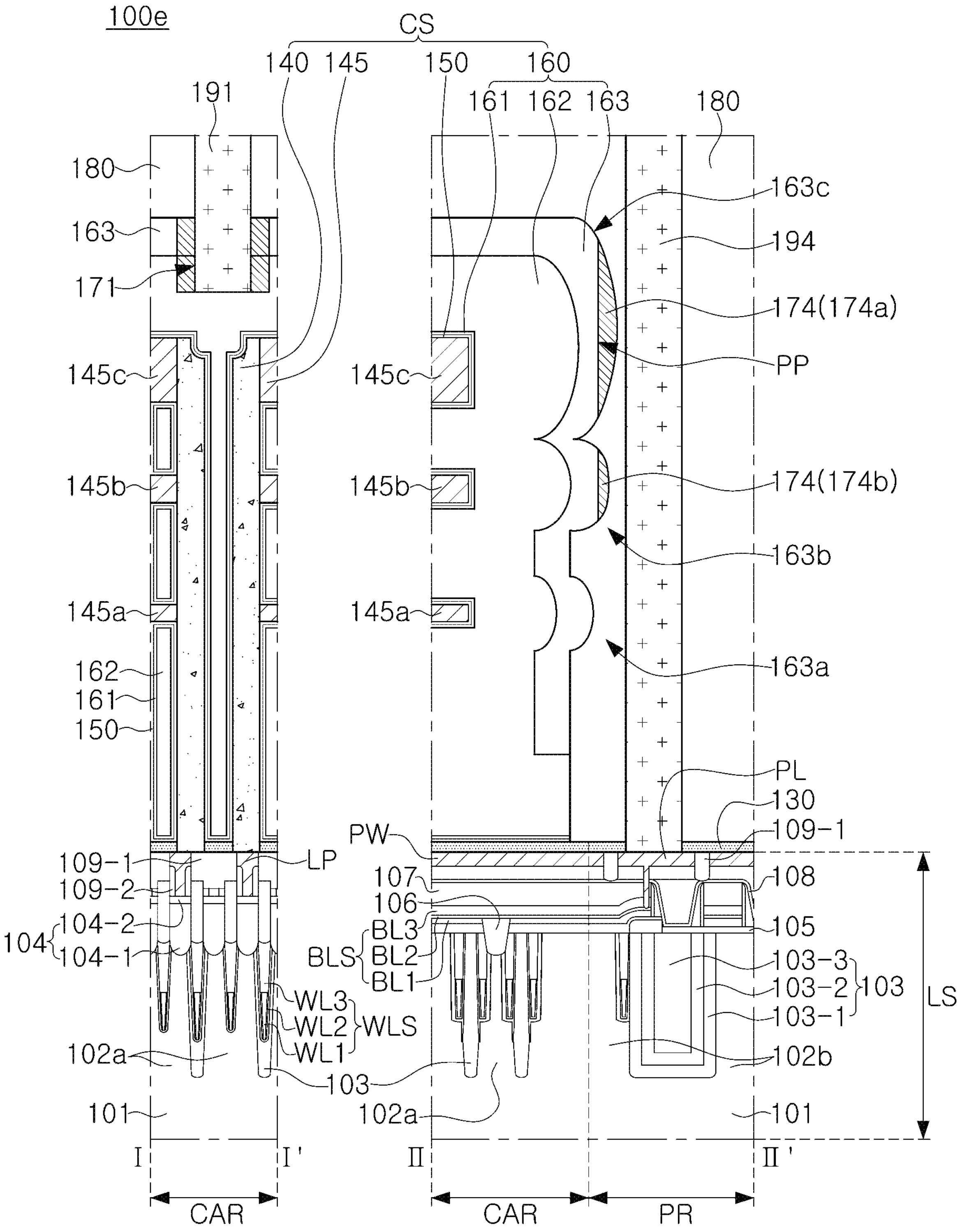
FIG. 7 is a schematic cross-sectional view of a semiconductor device according to example embodiments.

FIG. 7 is a schematic cross-sectional view of a semiconductor device 100*e* according to example embodiments. FIG. 7 illustrates regions corresponding to cross-sections of the semiconductor device of FIG. 1, taken along lines I-I' and II-II'.

Referring to FIG. 7, a peripheral contact plug 194 and a lower oxide layer 174 may be spaced apart from each other.

An interlayer insulating layer 180 may be disposed between the peripheral contact plug 194 and the lower oxide layer 174. Although a second material layer 163 of an upper electrode 160 is not exposed due to a contact hole for forming the peripheral contact plug 194, the lower oxide layer 174 may be formed by oxidizing a portion of the second material layer 163 in a separate oxidation process. Therefore, the lower oxide layer 174 may be in contact with at least a portion of protruding regions PP of the second material layer 163, and may be spaced apart from the peripheral contact plug 194.

Figure 8:
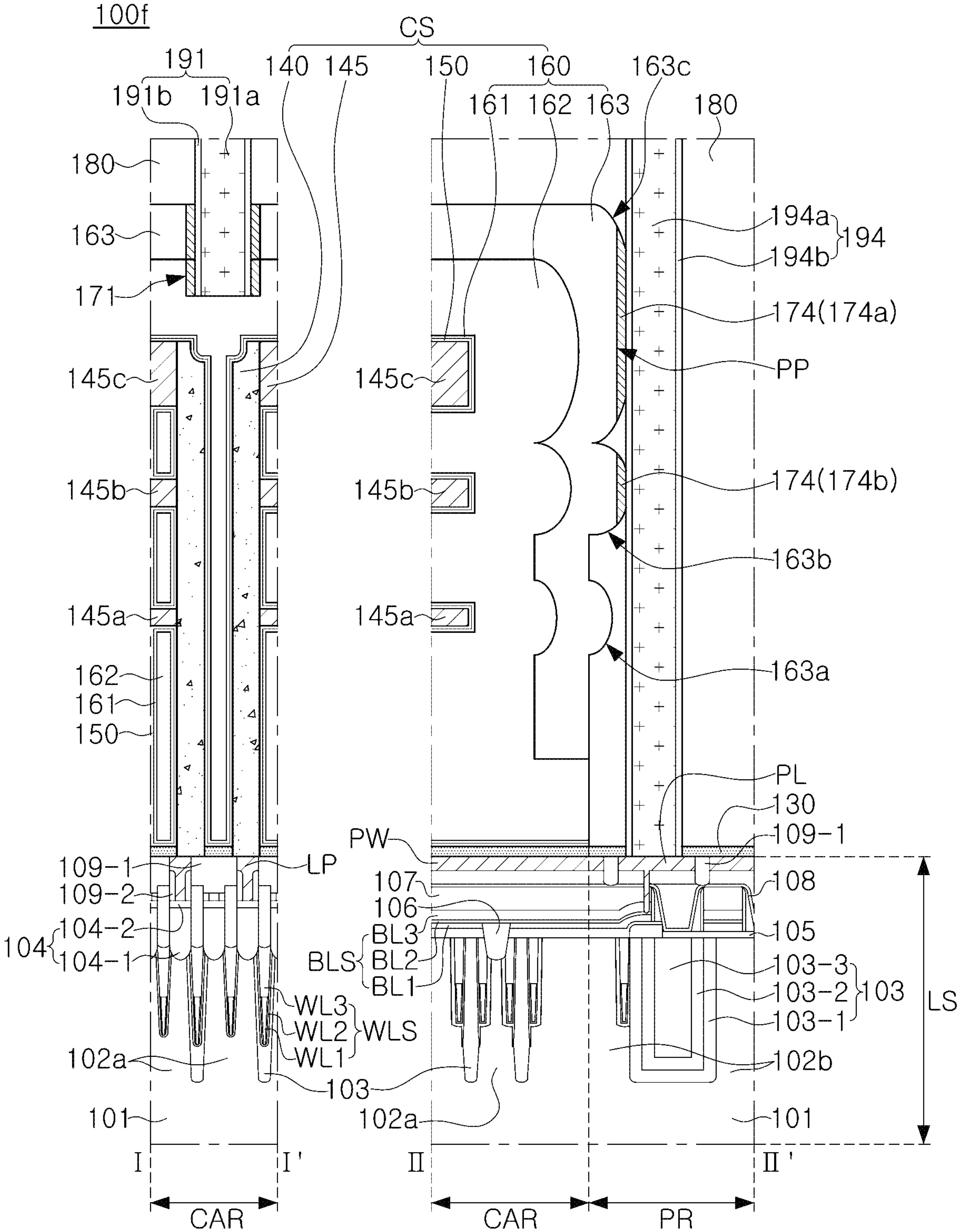
FIG. 8 is a schematic cross-sectional view of a semiconductor device according to example embodiments.

FIG. 8 is a schematic cross-sectional view of a semiconductor device 100*f* according to example embodiments. FIG. 8 illustrates regions corresponding to cross-sections of the semiconductor device of FIG. 1, taken along lines I-I' and II-II'.

Referring to FIG. 8, a peripheral contact plug 194 may include a second plug layer 194*a* and a second spacer layer 194*b* surrounding a sidewall of the second plug layer 194*a*. The second spacer layer 194*b* may be a structure for electrical separation between an upper electrode 160 and the second plug layer 194*a*. A semiconductor device 100*f* having improved electrical characteristics may be provided by the peripheral contact plug 194 including the second spacer layer 194*b*. The second spacer layer 194*b* may include or may be formed of an insulating material, for example, silicon oxide. The second spacer layer 194*b* may be in contact with the peripheral contact plug 194 and a lower oxide layer 174.

Similarly, an upper electrode contact plug 191 may include a first plug layer 191*a* and a first spacer layer 191*b* surrounding a sidewall of the first plug layer 191*a*.

FIGS. 9A to 9G are cross-sectional views illustrating a method of manufacturing a semiconductor device according to example embodiments. FIGS. 9A to 9G illustrate cross-sections of the semiconductor device of FIG. 1, taken along lines I-I' and II-II'.

Figure 9A:
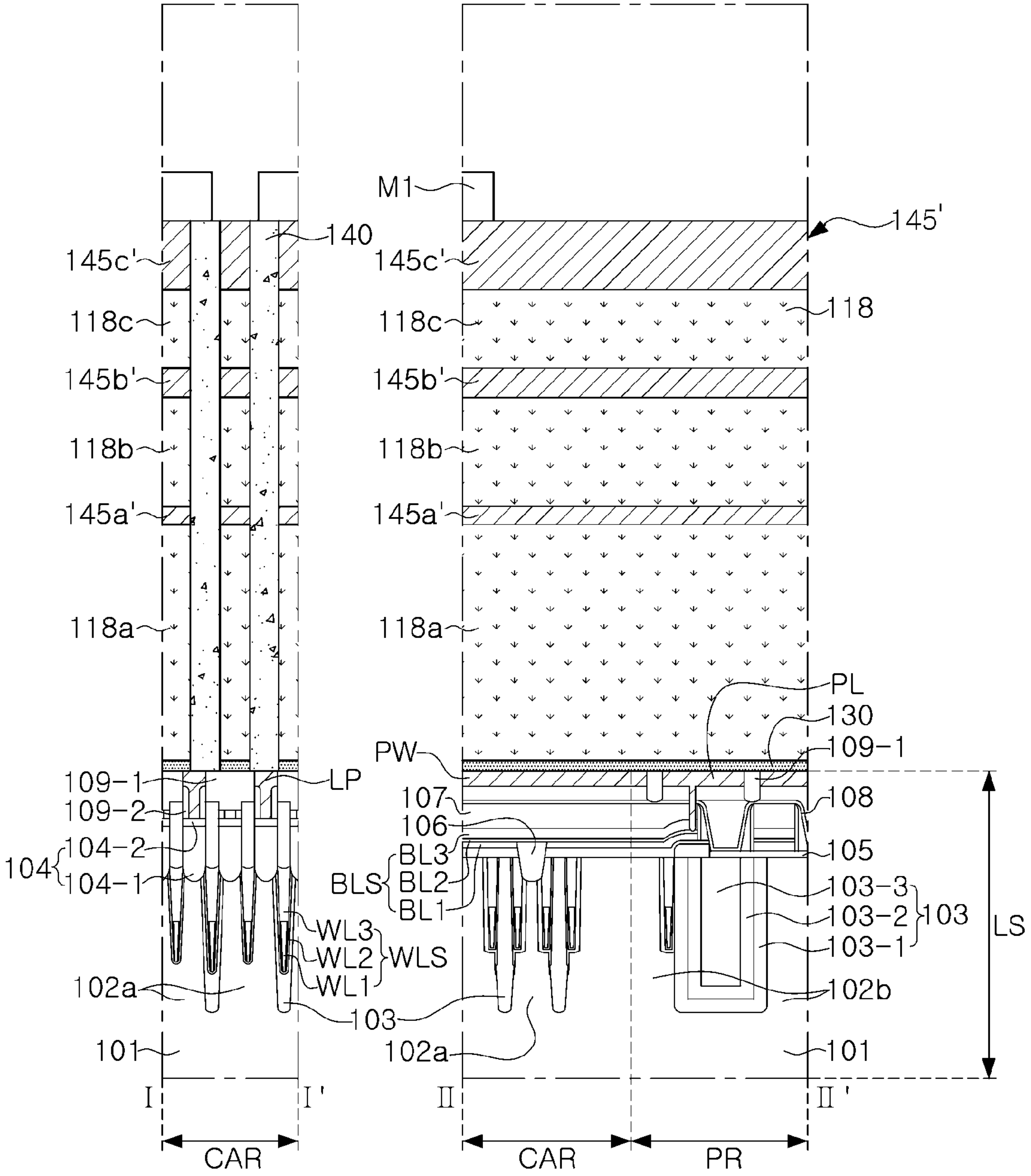
FIGS. 9A to 9G are cross-sectional views illustrating a method of manufacturing a semiconductor device according to example embodiments.

Referring to FIG. 9A, a lower structure LS may be formed, mold layers 118 and preliminary supporter layers 145' may be alternately stacked on the lower structure LS, and a plurality of lower electrodes 140 passing through the mold layers 118 and the preliminary supporter layers 145' may be formed.

First, active regions 102*a* and a device isolation region 103 defining the active regions 102*a* may be formed on a substrate 101 including a cell array region CAR and a peripheral region PR. In an example embodiment, the cell array region CAR may be a memory cell array region of a memory device such as a DRAM, and the peripheral region PR may be a region including peripheral circuits around the memory cell array region. A portion of the substrate 101 may be removed to form trenches extending in a first direction, and a word line structure WLS may be formed in the trenches. Impurity regions may be formed on opposite sides of the word line structure WLS. A buffer insulating layer 105, and a bit line structure BLS extending in a second direction intersecting the first direction, may be formed on the word line structure WLS. On the cell array region CAR, a lower electrode contact pattern 104 may be formed by filling a lower electrode contact hole passing through at least a portion of the bit line structure BLS with a conductive material. An opening passing through a portion of the bit line structure BLS to expose the portion of the bit line structure BLS may be formed. The opening and the bit line structure BLS may be covered with a conductive material. An insulating pattern 109-1 separating the conductive material may be formed to form cell landing pads LP on the cell array region CAR, a peripheral landing pad PL on the peripheral region PR, and vias connected to the cell landing pads LP or the peripheral landing pad PL. Therefore, a lower structure LS including the substrate 101, the bit line structure BLS, and the word line structure WLS may be formed.

Next, an etch stop layer 130 may be conformally formed on the lower structure LS, and mold layers 118 and preliminary supporter layers 145' may be alternately stacked on the etch stop layer 130. The etch stop layer 130 may include or may be formed of an insulating material having etch selectivity with respect to the mold layers 118 under specific etch conditions. For example, the insulating material may include or may be at least one of silicon nitride (SiN) and silicon carbonitride (SiCN). In an example embodiment, the mold layers 118 and the preliminary supporter layers 145' may be formed of three layers. The preliminary supporter layers 145' may include a first preliminary supporter layer 145*a*', a second preliminary supporter layer 145*b*', and a third preliminary supporter layer 145*c*', sequentially stacked on each other. The first preliminary supporter layer 145*a*' may have a smaller thickness than the second preliminary supporter layer 145*b*', and the second preliminary supporter layer 145*b*' may have a smaller thickness than the third preliminary supporter layer 145*c*'. The mold layers 118 may include first to third mold layers 118*a*, 118*b*, and 118*c*, sequentially stacked on each other. The first mold layer 118*a* may have a greater thickness than the second mold layer 118*b*, and the second mold layer 118*b* may have a greater thickness than the third mold layer 118*c*. The mold layers 118 may include or may be formed of materials having etch selectivity with respect to the preliminary supporter layers 145' under specific etch conditions. For example, the mold layers 118 may include or may be formed of silicon oxide, and the preliminary supporter layers 145' may include or may be formed of silicon nitride. According to embodiments, the mold layers 118 may include different materials. For example, the third mold layer 118*c* may include or may be formed of a nitride-based material that is different from the first and second mold layers 118*a* and 118*b*.

Next, a plurality of holes passing through the mold layers 118 and the preliminary supporter layers 145' may be formed on the cell array region CAR, and a conductive material may be filled in the plurality of holes to form a plurality of lower electrodes 140. The plurality of holes may pass through the etch stop layer 130 to expose the cell landing pads LP, respectively. The plurality of lower electrodes 140 may be formed by filling the plurality of holes with the conductive material and performing a chemical mechanical polishing (CMP) process or the like.

Next, a first mask M1 may be formed on an uppermost preliminary supporter layer 145' on the cell array region CAR. The first mask M1 may have a structure including a plurality of hole-shaped openings exposing at least a portion of the plurality of lower electrodes 140.

Figure 9B:
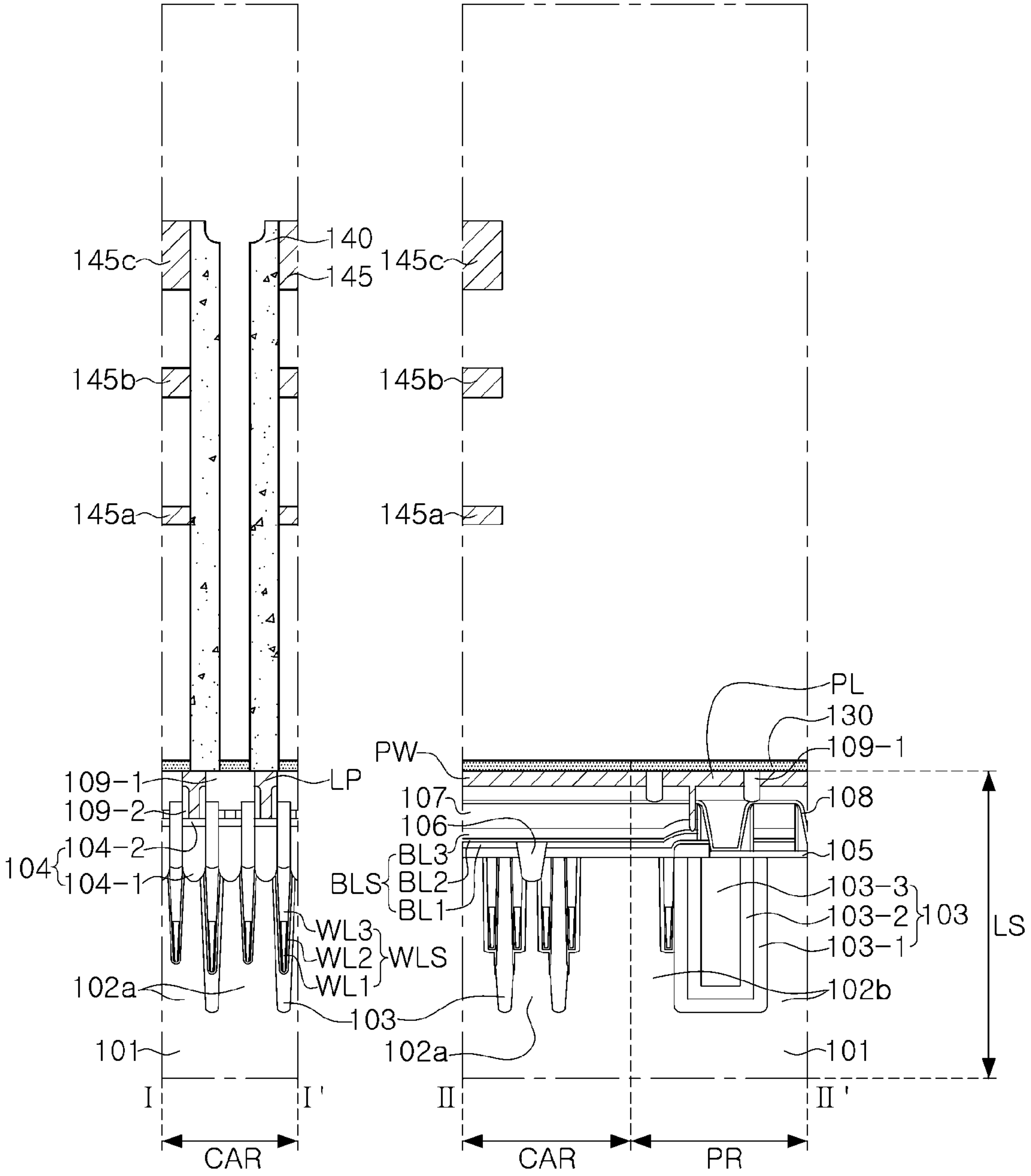

Referring to FIG. 9B, at least a portion of the mold layers 118 and at least a portion of the preliminary supporter layers 145' may be removed to form supporter layers 145, using the first mask M1 as an etching mask, and a remaining portion of the mold layers 118 may be removed.

The first mask M1 may be a mask for forming the supporter layers 145. An etching process may be performed on portions of the mold layers 118 and portions of the preliminary supporter layers 145'. The first mask M1 may not overlap (i.e., may expose) the portions of the mold layers 118 and the portions of the preliminary supporter layers 145' in the Z-direction. In the etching process, the first mask M1 may serve as an etching mask to form supporter layers 145.

Each of the supporter layers 145 may be patterned, according to a structure of the first mask M1, to have a shape having a plurality of openings. In the etching process, at least a portion of exposed upper surfaces of the plurality of lower electrodes 140 may be etched together. The supporter layers 145 may connect a plurality of adjacent lower electrodes 140. For example, the supporter layers 145 may be disposed between two adjacent lower electrodes among the plurality of lower electrodes 140 to prevent the lower electrodes 140 from collapsing or bending in a fabrication process of a semiconductor device. The remaining portion of the mold layers 118 may be selectively removed with respect to the supporter layers 145. In an example embodiment, the third supporter layer 145*c*' may be etched using an anisotropic etching process to form a third supporter layer 145*c*, and the third mold layer 118*c* may be removed using an isotropic etching process, before etching the second preliminary supporter layer 145*b*'. Similarly, after etching the second preliminary supporter layer 145*b*' using an anisotropic etching process to form a second supporter layer 145*b*, the second mold layer 118*b* may be removed using an isotropic etching process. After etching the first preliminary supporter layer 145*a*' using an anisotropic etching process to form a first supporter layer 145*a*, the first mold layer 118*a* may be removed using an isotropic etching process. The first mask M1 may be removed after etching the mold layers 118 or while etching the mold layers 118.

Figure 9C:
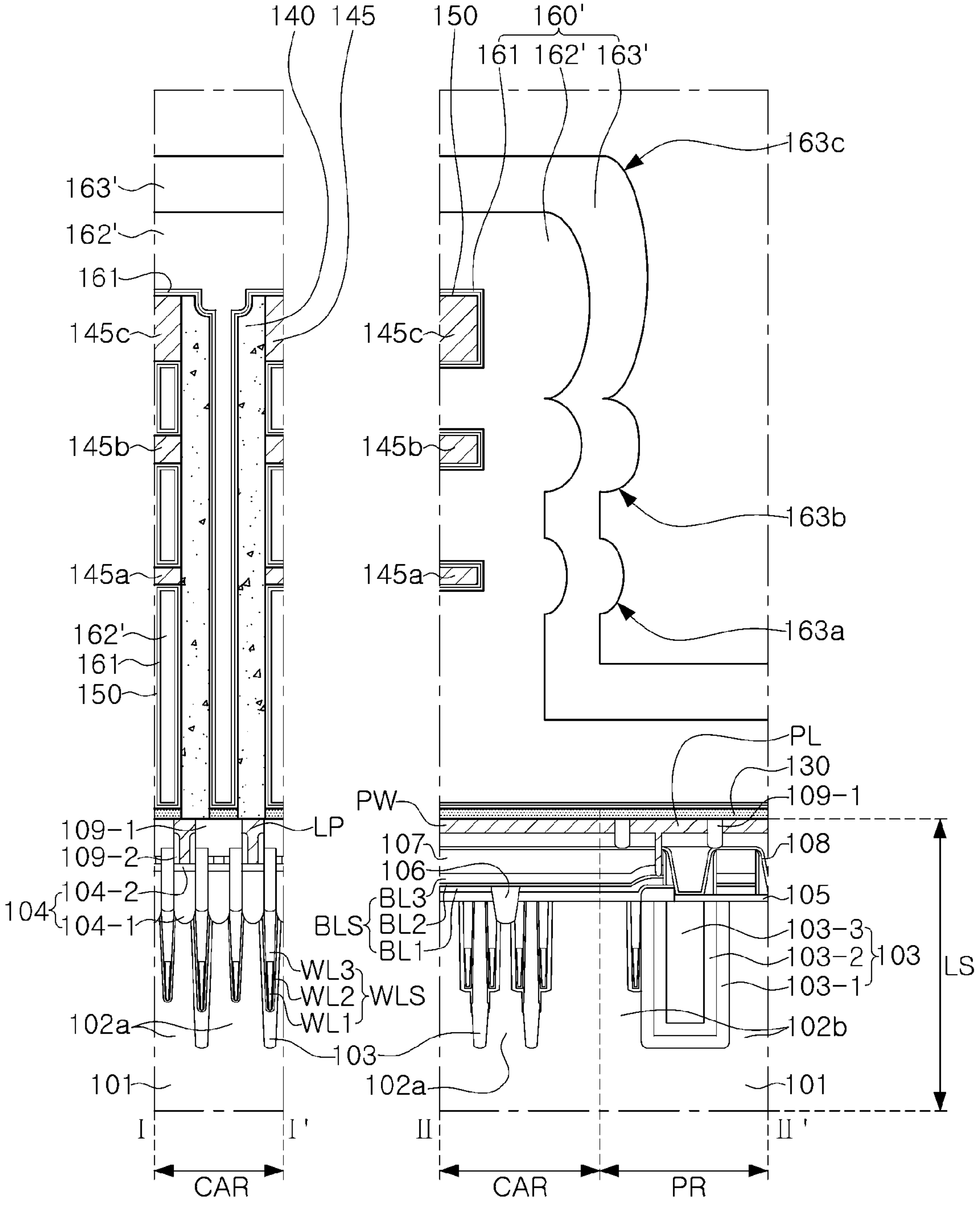

Referring to FIG. 9C, a dielectric layer 150, a metal-containing layer 161, a first material layer 162', and a second material layer 163' may be sequentially formed to cover the plurality of lower electrodes 140 and the supporter layers 145.

The dielectric layer 150 conformally covering exposed side surfaces of the plurality of lower electrodes 140 and surfaces of the supporter layers 145 may be formed, together with the etch stop layer 130. The dielectric layer 150 may include or may be formed of a high-κ dielectric material, silicon oxide, silicon nitride, silicon oxynitride, or a combination thereof. The metal-containing layer 161 may be a metal layer conformally covering the dielectric layer 150. The metal-containing layer 161 may include or may be formed of, for example, titanium nitride (TiN). The first material layer 162' may cover the plurality of lower electrodes 140 and the supporter layers 145 while filling spaces between the plurality of lower electrodes 140 on the dielectric layer 150. The first material layer 162' may cover the etch stop layer 130 while extending from the cell array region CAR to the peripheral region PR. The first material layer 162' may include or may be formed of a semiconductor material, for example, doped silicon germanium. The second material layer 163' may extend from the cell array region CAR to the peripheral region PR while covering upper and side surfaces of the first material layer 162'.

The first material layer 162' and the second material layer 163' may include regions protruding from the supporter layers 145, while covering the supporter layers 145 extending from the plurality of lower electrodes 140. In an example embodiment, the second material layer 163' may include at least one protruding region PP protruding in a horizontal direction from the cell array region CAR to the peripheral region PR. The protruding regions PP may be disposed on an outer side surface of the second material layer 163'.

In an example embodiment, the protrusion regions PP may include a first protrusion 163*a* including a portion located at substantially the same level as the first supporter layer 145*a*, a second protrusion 163*b* including a portion located at substantially the same level as the second supporter layer 145*b*, and a third protrusion 163*c* including a portion located at substantially the same level as the third supporter layer 145*c*. Sizes and protruding distances of the first to third protrusions 163*a*, 163*b*, and 163*c* may be changed depending on thicknesses of the supporter layers 145 or the like.

Figure 9D:
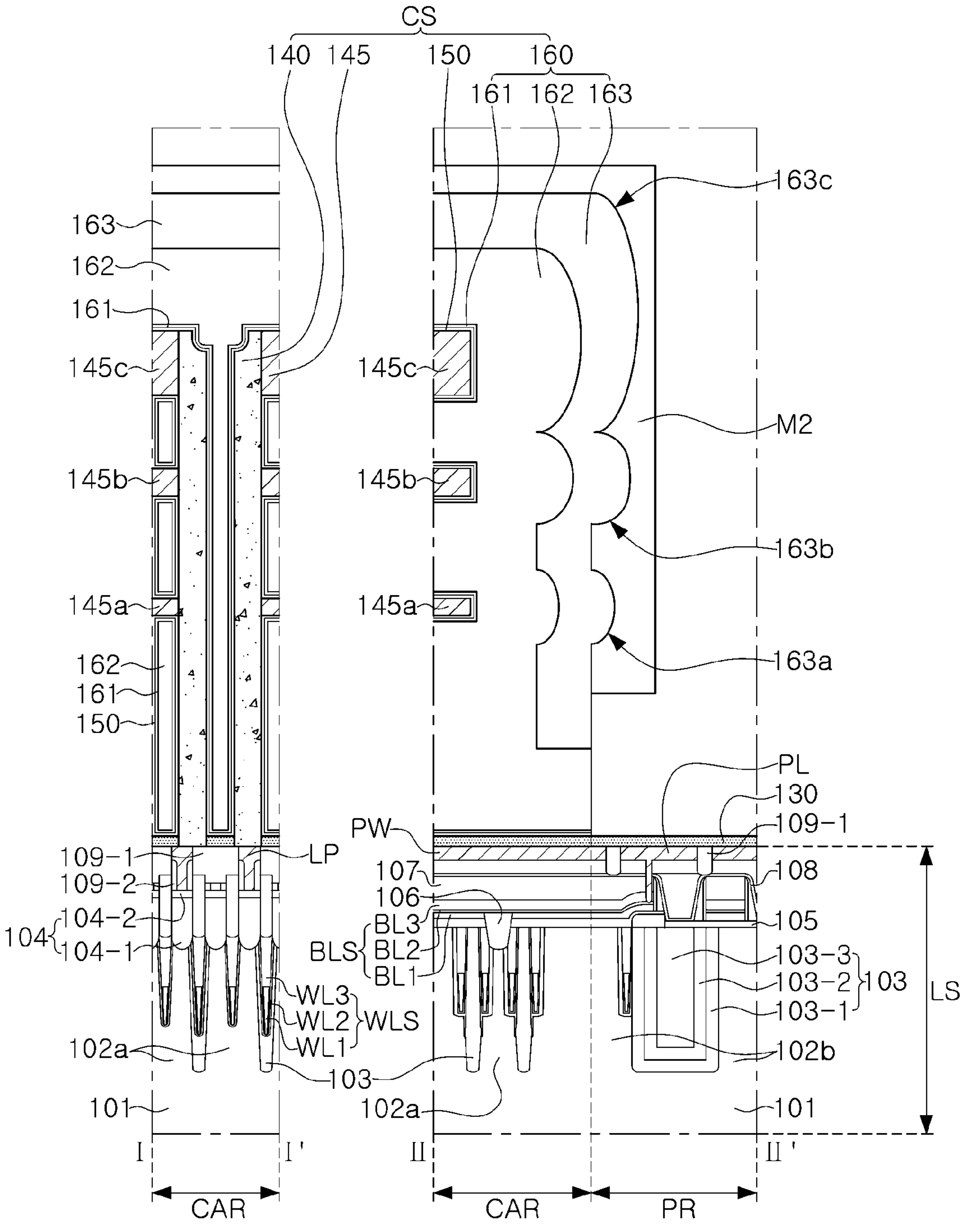

Referring to FIG. 9D, a second mask M2 covering a portion of the second material layer 163' may be formed, and a portion of the second material layer 163' and a portion of the first material layer 162' may be removed to form a capacitor structure CS.

A second mask M2 covering an upper surface of the second material layer 163' covering the plurality of lower electrodes 140 on the cell array region CAR and a side surface of the second material layer 163' including the protruding regions PP may be formed. The second mask M2 may be an etching mask for separating a capacitor structure CS from structures on the peripheral region PR. A portion of the second material layer 163' and a portion of the first material layer 162' on the peripheral region PR may be removed using the second mask M2 as an etching mask. Therefore, the etch stop layer 130 on the peripheral region PR may be exposed.

Next, as an etching process is additionally performed using the second mask M2, a side surface of a first material layer 162 and a side surface of a second material layer 163 may not be coplanar with a side surface of the second etching mask M2, and may be recessed in a direction in which the plurality of lower electrodes 140 are arranged. In an example embodiment, a depth, recessed as above, may be substantially equal to a thickness of the second mask M2. Therefore, a portion of the side surface of the second material layer 163 contacting the second mask M2 may be coplanar with a portion of the side surface of the second material layer 163 not contacting the second mask M2. According to embodiments, the recessed depth may be adjusted according to the additional etching process.

Figure 9E:
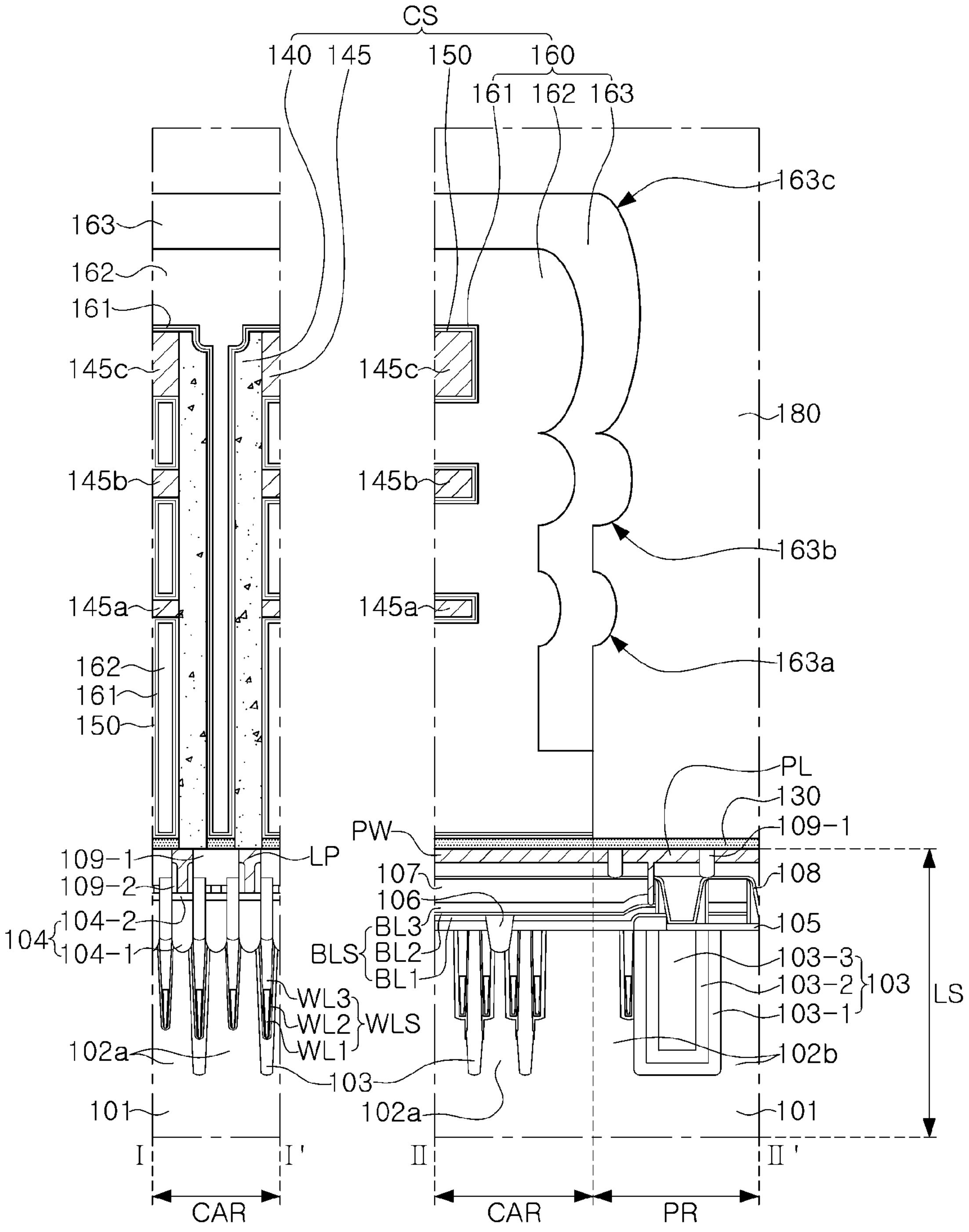

Referring to FIG. 9E, the second mask M2 may be removed, and an interlayer insulating layer 180 covering the capacitor structure CS and a portion of the etch stop layer 130 on the peripheral region PR may be formed. The interlayer insulating layer 180 may include or may be formed of an insulating material, for example, silicon oxide.

Figure 9F:
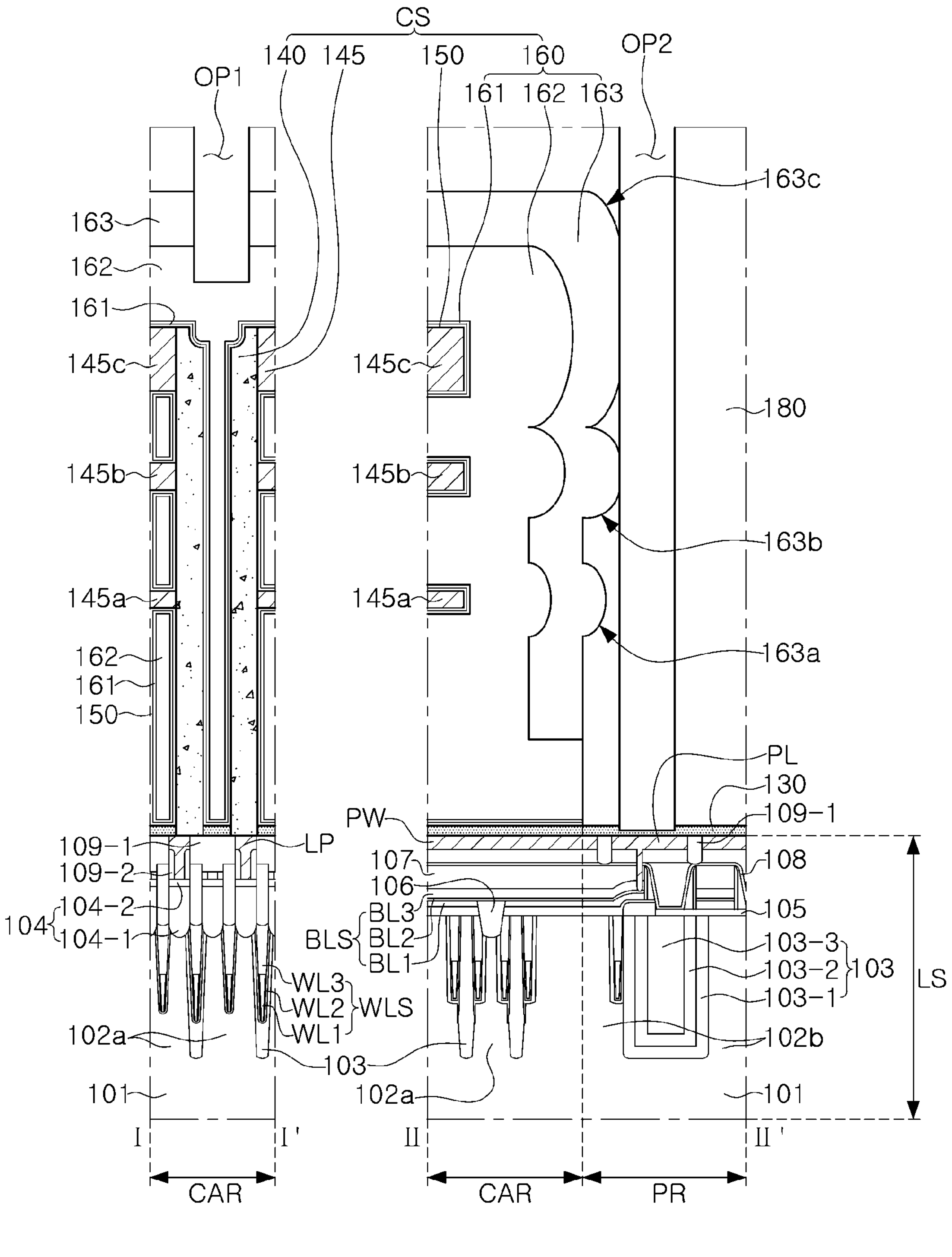

Referring to FIG. 9F, a first opening OP1 passing through at least a portion of the upper electrode 160, and a second opening OP2 passing through at least a portion of the etch stop layer 130 on the peripheral region PR may be formed.

The first opening OP1 may pass through at least a portion of the interlayer insulating layer 180 and at least a portion of the upper electrode 160 on the cell array region CAR, to expose at least a portion of the first material layer 162. For example, the first opening OP1 may pass through the interlayer insulating layer 180 and the second material layer 163, and may extend into the first material layer 162 without passing through the first material layer 162. The present invention is not limited thereto. According to embodiments, the first opening OP1 may pass through only at least a portion of the second material layer 163, without extending into the first material layer 162. The first opening OP1 may be a region in which an upper electrode contact plug 191 (refer to FIG. 2) is formed in a subsequent process.

The second opening OP2 may pass through at least a portion of the interlayer insulating layer 180 and at least a portion of the etch stop layer 130 on the peripheral region PR. In an example embodiment, the second and third protrusions 163*b* and 163*c* of the second material layer 163 may be partially exposed through the second opening OP2.

The second and third protrusions 163*b* and 163*c* may be partially etched during a process of forming the second opening OP2. The second opening OP2 may not pass completely through the etch stop layer 130. This may be to prevent the peripheral landing pad PL from being oxidized in a subsequent process.

In this operation, as portions of the second and third protrusions 163*b* and 163*c* remain without being etched, the semiconductor device 100*c* of FIG. 5 may be formed.

Figure 9G:
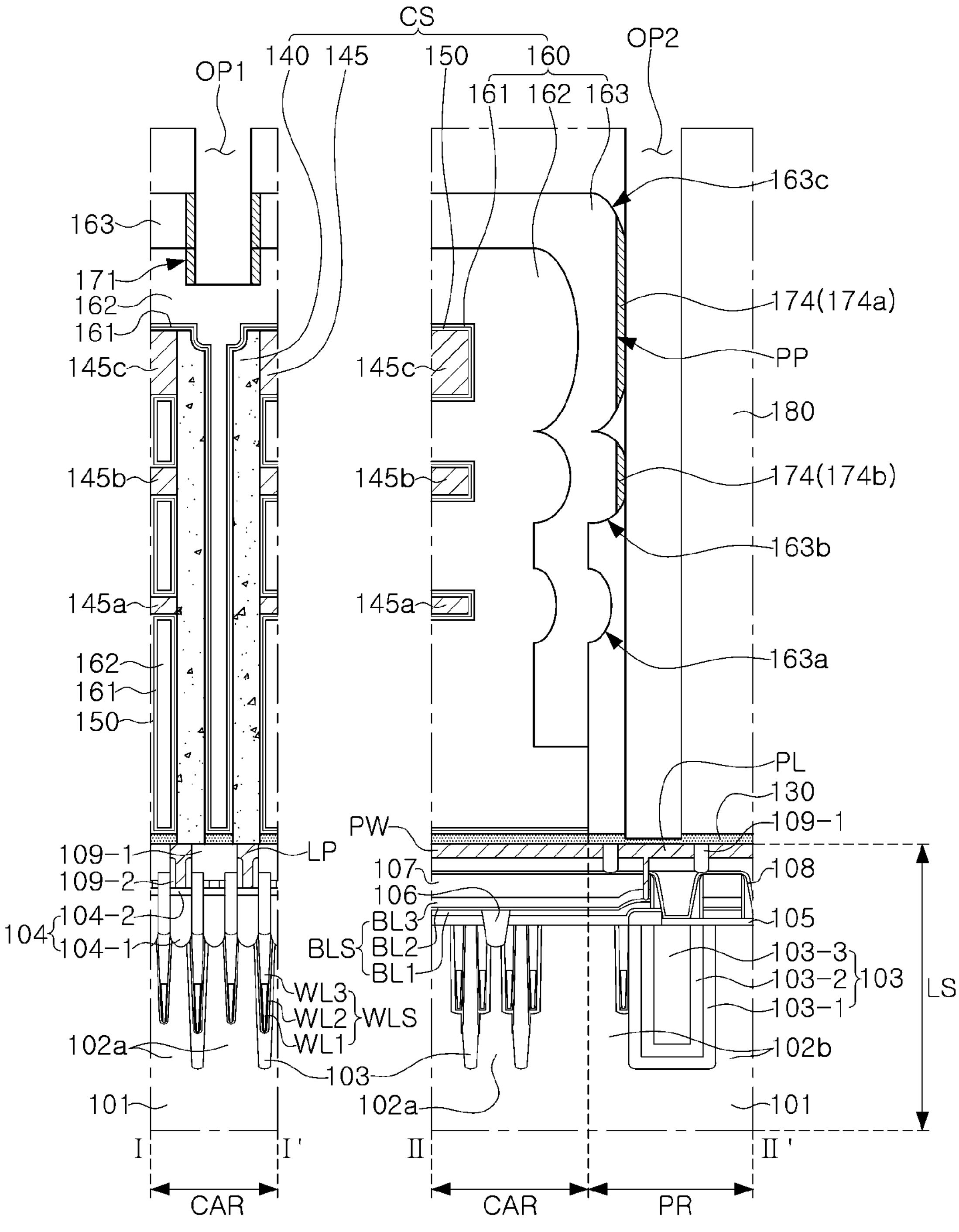

Referring to FIG. 9G, oxide layers 171 and 174 may be formed by oxidizing at least a portion of the upper electrode 160 exposed through the first opening OP1 and the second opening OP2.

In an example embodiment, when the first opening OP1 passes through the second material layer 163 and extends into the first material layer 162, at least a portion of the first and second material layers 162 and 163 exposed through an inner sidewall and a bottom surface of the first opening OP1 may be replaced with a first oxide layer 171 in an oxidation process (i.e., may be oxidized). Next, the bottom surface of the first opening OP1 may be additionally etched to expose the second material layer 163. Therefore, the first oxide layer 171 may surround the inner sidewall of the first opening OP1 and may be in contact with the upper electrode 160. For example, the first oxide layer 171 may expose the first material layer 162, and may contact the first and second material layers 162 and 163.

At least a portion of the second and third protrusions 163*b* and 163*c* of the second material layer 163 exposed through the second opening OP2 may be replaced with a second oxide layer 174 in the oxidation process (i.e., may be oxidized). Therefore, the second oxide layer 174 may be disposed between the protruding regions PP of the second material layer and the second opening OP2. A thickness of the second oxide layer 174 may be adjusted according to conditions of the oxidation process. According to embodiments, the second oxide layer 174 may further extend in an inward direction as well as along the second and third protrusions 163*b* and 163*c*.

Next, referring to FIG. 2, a bottom surface of the second opening OP2 may be additionally etched to expose the peripheral landing pad PL. Next, an upper electrode contact plug 191 may be formed by filling the first opening OP1 with a conductive material, and a peripheral contact plug 194 may be formed by filling the second opening OP2 with a conductive material. The peripheral contact plug 194 may be electrically isolated from the upper electrode 160 by the second oxide layer 174. Therefore, it is possible to provide a semiconductor device 100 having improved electrical characteristics while minimizing a margin region between the upper electrode 160 and the peripheral contact plug 194 by the protruding regions PP of the upper electrode 160.

According to embodiments of the present inventive concept, a semiconductor device electrically separating from a peripheral contact plug from an upper electrode of a capacitor structure may be provided by forming an oxide layer contacting a portion of the upper electrode of the capacitor structure. The oxide layer may be formed by oxidizing a portion of the upper electrode via an opening in which the peripheral contact plug is to be formed.

The present inventive concept is not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:

a substrate having a cell array region and a peripheral region;

a plurality of lower electrodes disposed on the cell array region;

a first supporter layer directly contacting the plurality of lower electrodes and extending in a lateral direction, parallel to an upper surface of the substrate;

a dielectric layer covering the plurality of lower electrodes and the first supporter layer;

an upper electrode covering the dielectric layer;

an interlayer insulating layer covering an upper surface of the upper electrode and a side surface of the upper electrode;

a peripheral contact plug passing through the interlayer insulating layer and disposed on the peripheral region of the substrate; and a first oxide layer between the upper electrode and the peripheral contact plug, wherein the upper electrode comprises a first protruding region protruding in the lateral direction and extending from the cell array region toward the peripheral region, wherein the first oxide layer is disposed between the peripheral contact plug and the first protruding region, and wherein the first oxide layer directly contacts the peripheral contact plug and the first protruding region.

2. The semiconductor device of claim 1, wherein the upper electrode comprises:

a first material layer; and a second material layer covering the first material layer and having a material different from a material of the first material layer.

3. The semiconductor device of claim 2, wherein the first material layer comprises doped silicon germanium (SiGe), and wherein the second material layer comprises doped silicon (Si).

4. The semiconductor device of claim 2, wherein a thickness of the first material layer is greater than a thickness of the second material layer.

5. The semiconductor device of claim 2, wherein the first material layer covers upper surfaces and side surfaces of the plurality of lower electrodes, and wherein the second material layer covers an upper surface of the first material layer and covers at least a portion of a side surface of the first material layer.

6. The semiconductor device of claim 5, wherein the second material layer has a lower end positioned at a level higher than lower surfaces of the plurality of lower electrodes and lower than the upper surfaces of the plurality of lower electrodes, and wherein the first material layer comprises an extension region extending into a space between the lower end of the second material layer and the substrate.

7. The semiconductor device of claim 1, further comprising:

a second supporter layer directly contacting the plurality of lower electrodes and extending in the lateral direction and disposed below the first supporter layer, wherein the upper electrode further comprises a second protruding region protruding in the lateral direction and extending from the cell array region toward the peripheral region, wherein the first protruding region is located on substantially the same level as the first supporter layer, wherein the second protruding region is located on substantially the same level as the second supporter layer, and wherein a portion of the interlayer insulating layer fills a space defined by the first protruding region, the second protruding region, and the peripheral contact plug.

8. The semiconductor device of claim 1, further comprising:

an upper electrode contact plug having a lower end buried in the upper electrode to be electrically connected to the upper electrode; and a second oxide layer between a portion of a side surface of the upper electrode contact plug and the upper electrode, wherein a lower surface of the upper electrode contact plug directly contacts the upper electrode.

9. The semiconductor device of claim 8, wherein the upper electrode comprises:

a first material layer; and a second material layer covering the first material layer and having a material, different from a material of the first material layer, wherein the upper electrode contact plug passes through the second material layer and extends into the first material layer, wherein the second oxide layer comprises:

a lower oxide region between the side surface of the upper electrode contact plug and the first material layer; and an upper oxide region between the side surface of the upper electrode contact plug and the second material layer, and wherein the lower and upper oxide regions comprise different materials.

10. The semiconductor device of claim 8, wherein the lower surface of the upper electrode contact plug is disposed at a level lower than a level of the second oxide layer.

11. The semiconductor device of claim 1, wherein the peripheral contact plug further comprises a recessed region in a direction toward an inside of the peripheral contact plug, and wherein a portion of the first oxide layer is disposed in the recessed region and directly contacts the recessed region.

12. The semiconductor device of claim 1, further comprising:

a plurality of word lines disposed on the substrate and extending in a first direction; and a plurality of bit lines disposed on the substrate, extending in a second direction, intersecting the first direction, wherein the plurality of lower electrodes are disposed at a higher level than the plurality of word lines and the plurality of bit lines, and wherein the peripheral contact plug is electrically connected to at least one bit line among the plurality of bit lines.

13. A semiconductor device comprising:

a substrate having a cell array region and a peripheral region;

a capacitor structure including a plurality of lower electrodes disposed on the cell array region, a dielectric layer on the plurality of lower electrodes, and an upper electrode covering the dielectric layer;

an interlayer insulating layer covering the capacitor structure;

an upper electrode contact plug passing through the interlayer insulating layer and including a portion extending into the upper electrode to be electrically connected to the upper electrode; and an upper oxide layer extending into the upper electrode from an upper surface of the upper electrode toward the substrate and disposed between the upper electrode and a side surface of the portion of the upper electrode contact plug.

14. The semiconductor device of claim 13, wherein the interlayer insulating layer covers an upper surface of the upper oxide layer.

15. The semiconductor device of claim 13, wherein a lower surface of the upper electrode contact plug is disposed at a level lower than a level of the upper oxide layer.

16. The semiconductor device of claim 13, further comprising:

a peripheral contact plug disposed on the peripheral region and passing through the interlayer insulating layer; and a lower oxide layer between the peripheral contact plug and the upper electrode.

17. The semiconductor device of claim 16, wherein the upper electrode comprises at least one protruding region protruding from an outer side surface of the upper electrode toward the peripheral contact plug, wherein the lower oxide layer is disposed between the at least one protruding region and the peripheral contact plug, and wherein the lower oxide layer directly contacts the at least one protruding region and the peripheral contact plug.

18. The semiconductor device of claim 13, wherein each of the plurality of lower electrodes has a pillar shape, and wherein the upper electrode comprises:

a metal-containing layer covering the plurality of lower electrodes and the dielectric layer, a first material layer covering the metal-containing layer, and a second material layer covering the first material layer and including a material, different from a material of the first material layer.

19. A semiconductor device comprising:

a substrate having a cell array region and a peripheral region;

a plurality of word lines disposed on the substrate and extending in a first direction;

a plurality of bit lines disposed on the substrate and extending in a second direction intersecting the first direction;

a plurality of cell landing pads and a peripheral landing pad, disposed at a higher level than the plurality of word lines and the plurality of bit lines;

a plurality of lower electrodes disposed on the plurality of cell landing pads on the cell array region, respectively;

a dielectric layer covering each of the plurality of lower electrodes;

an upper electrode covering the dielectric layer;

an interlayer insulating layer covering an upper surface of the upper electrode and a side surface of the upper electrode;

an upper electrode contact plug passing through the interlayer insulating layer on the cell array region and electrically connected to the upper electrode;

a peripheral contact plug passing through the interlayer insulating layer on the peripheral region and directly contacting the peripheral landing pad;

an upper oxide layer between the upper electrode and a side surface of a portion of the upper electrode contact plug, wherein the portion of the upper electrode contact plug directly contacts a portion of the upper electrode exposed by the upper oxide layer; and a lower oxide layer between the upper electrode and the peripheral contact plug, wherein the lower oxide layer directly contacts the upper electrode and the peripheral contact plug.

20. The semiconductor device of claim 19, wherein the upper oxide layer and the lower oxide layer comprise silicon oxide.

* * * * *